US008638600B2

(12) United States Patent
Muralimanohar et al.

(10) Patent No.: US 8,638,600 B2
(45) Date of Patent: Jan. 28, 2014

(54) RANDOM-ACCESS MEMORY WITH DYNAMICALLY ADJUSTABLE ENDURANCE AND RETENTION

(75) Inventors: Naveen Muralimanohar, Santa Clara, CA (US); Jichuan Chang, Sunnyvale, CA (US); Parthasarathy Ranganathan, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 189 days.

(21) Appl. No.: 13/092,789

(22) Filed: Apr. 22, 2011

(65) Prior Publication Data

US 2012/0268983 A1   Oct. 25, 2012

(51) Int. Cl.
 *G11C 7/00* (2006.01)
(52) U.S. Cl.
 USPC .................. 365/163; 365/189.14; 365/189.16
(58) Field of Classification Search
 USPC .................................. 365/163, 189.14, 189.16
 See application file for complete search history.

(56) References Cited

U.S. PATENT DOCUMENTS

| | | | |
|---|---|---|---|
| 6,778,445 B2 * | 8/2004 | Ooishi et al. ............. 365/189.19 |
| 6,865,658 B2 | 3/2005 | Tomori et al. |
| 7,382,647 B1 | 6/2008 | Gopalakrishnan |
| 7,606,111 B2 * | 10/2009 | Lee et al. .................... 365/238.5 |
| 7,870,363 B2 | 1/2011 | Tang et al. |
| 7,889,544 B2 * | 2/2011 | Chow et al. ................... 365/163 |
| 7,911,871 B2 * | 3/2011 | Hidaka ..................... 365/230.03 |
| 7,936,610 B1 | 5/2011 | Melcher et al. |
| 8,195,912 B2 | 6/2012 | Flynn et al. |
| 8,209,471 B2 | 6/2012 | Yano et al. |
| 8,341,335 B2 | 12/2012 | Weingarten et al. |
| 8,356,153 B2 | 1/2013 | Franceschini et al. |
| 8,380,915 B2 | 2/2013 | Wood et al. |
| 2009/0027972 A1 | 1/2009 | Bode |
| 2009/0150894 A1 | 6/2009 | Huang et al. |
| 2009/0193184 A1 | 7/2009 | Yu et al. |
| 2010/0002499 A1 | 1/2010 | Breitwisch et al. |
| 2010/0064111 A1 | 3/2010 | Kumimatsu et al. |
| 2010/0146197 A1 | 6/2010 | Gorobets |
| 2010/0238730 A1 | 9/2010 | Dutta |
| 2010/0246247 A1 | 9/2010 | Kim et al. |
| 2011/0264842 A1 | 10/2011 | Nakanishi et al. |
| 2012/0284587 A1 | 11/2012 | Yu et al. |
| 2012/0317347 A1 | 12/2012 | Confalonieri et al. |

OTHER PUBLICATIONS

Burr, Geoffrey W., et al. "Phase change memory technology", Journal of Vacuum Science and Technology B., Mar. 29, 2010, vol. 28, issue 2, pp. 223-262.

* cited by examiner

*Primary Examiner* — Son Dinh

(57) ABSTRACT

A memory device is provided. The memory device comprises an array of memory cells, each including a volume of material that can stably exhibit at least two different physical states that are each associated with a different data value, word lines that each interconnects a row of memory cells within the array of memory cells to a word-line driver, and bit lines that each interconnects a column of memory cells, through a bit-line driver, to a write driver that is controlled, during a WRITE operation, to write an input data value to an activated memory cell at the intersection of the column of memory cells and an activated row of memory cells by generating a current density within the memory cells that corresponds to retention/endurance characteristics of the memory cell dynamically assigned to the memory cell by a memory controller, operating system, or other control functionality.

19 Claims, 23 Drawing Sheets

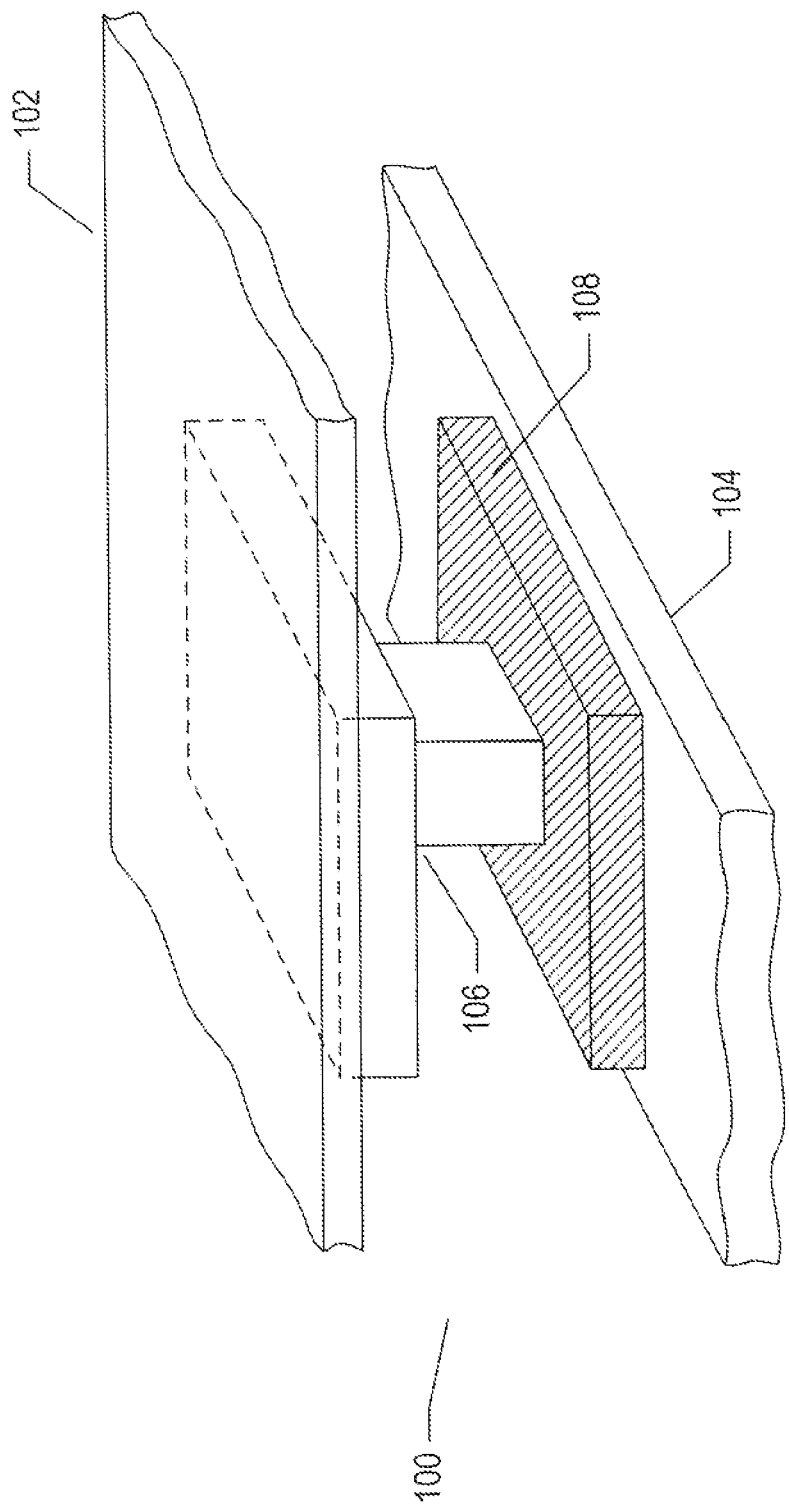

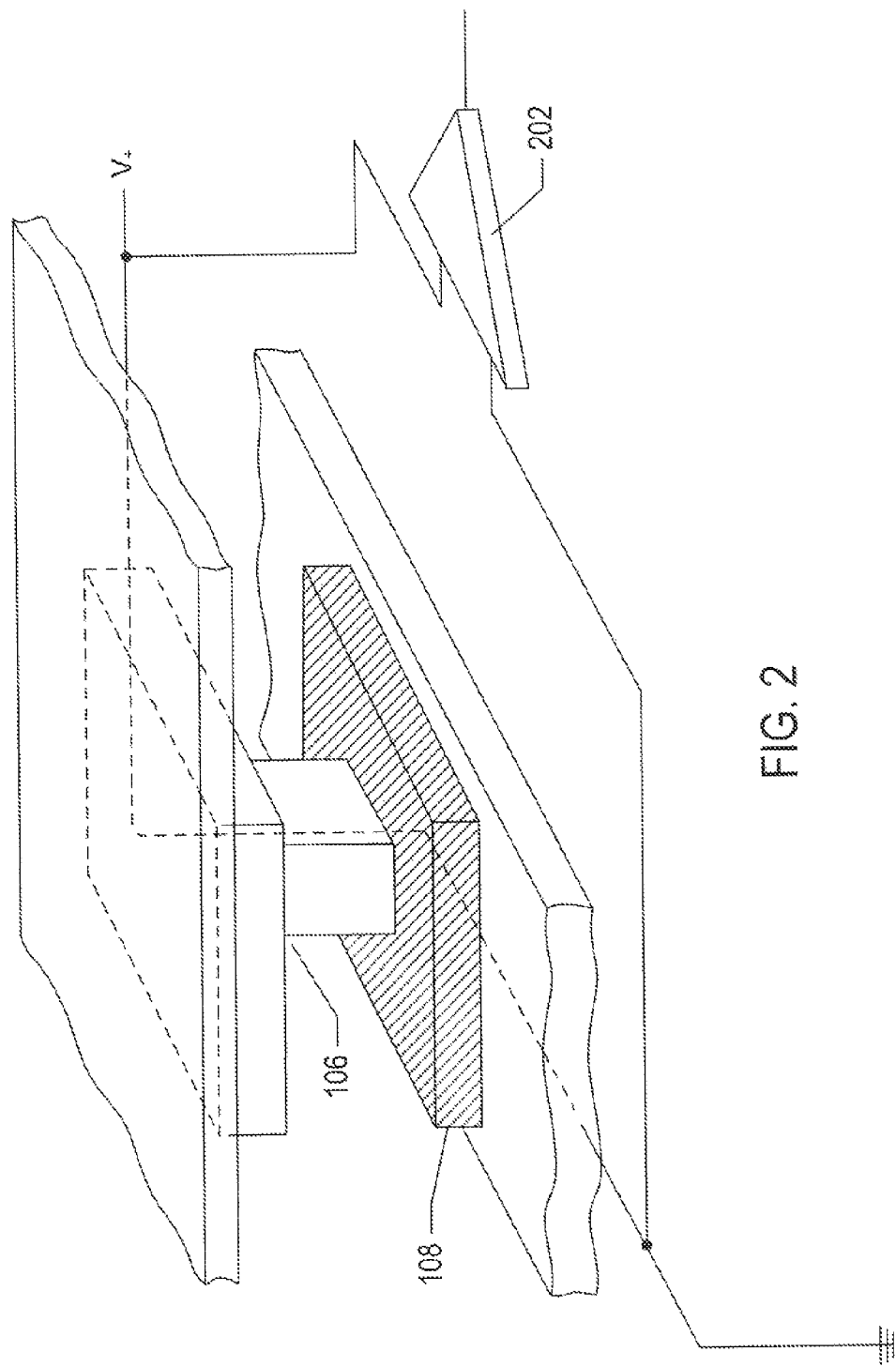

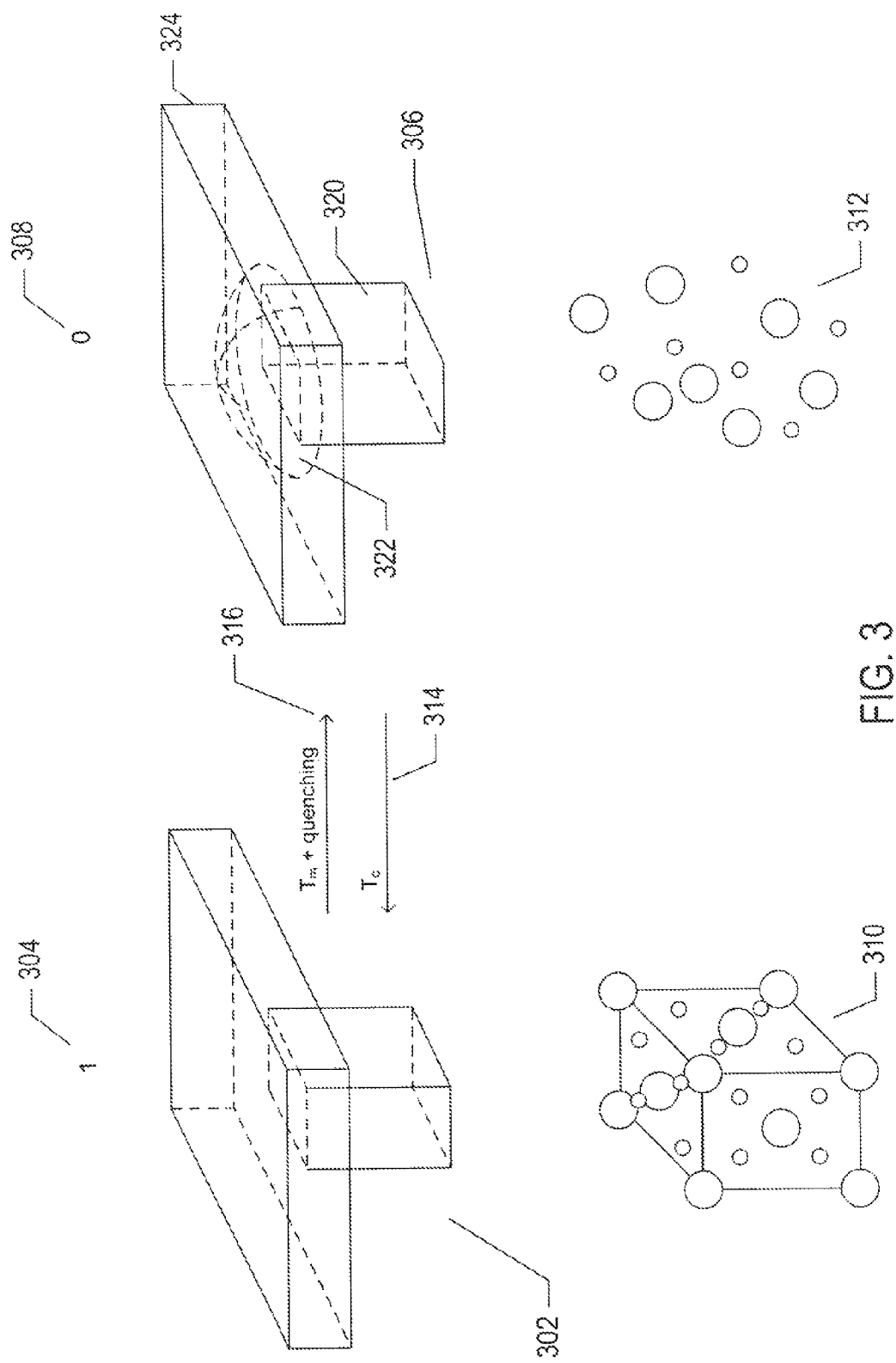

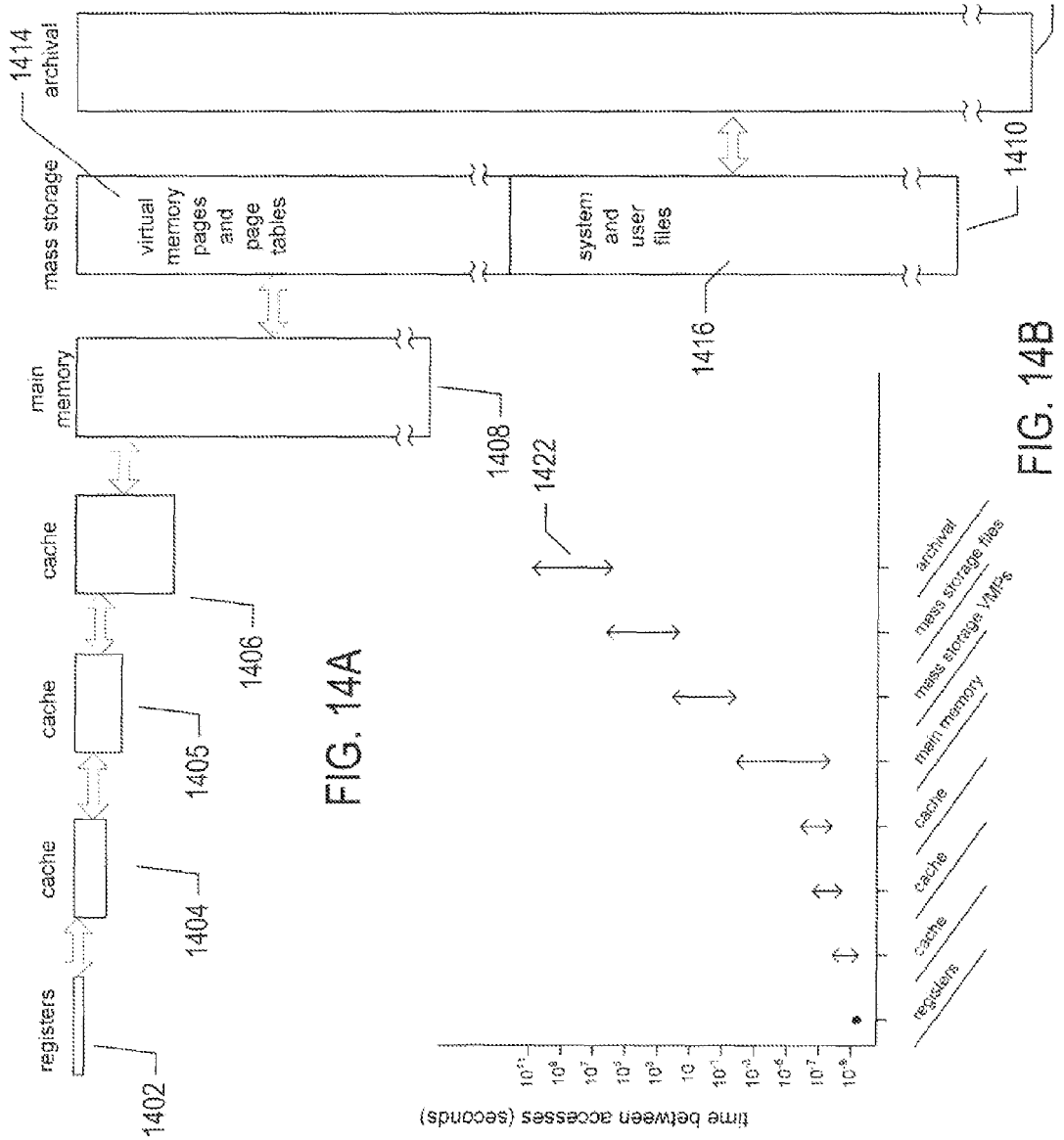

RANDOM-ACCESS MEMORY WITH DYNAMICALLY ADJUSTABLE ENDURANCE AND RETENTION

TECHNICAL FIELD

This application is directed to various types of random-access memory, the endurance and retention characteristics of which can be controlled by post-manufacture, dynamic adjustment.

BACKGROUND

Over the past 70 years, computer systems and computer-system components have rapidly evolved, producing a relentless increase in computational bandwidth and capabilities and decrease in cost, size, and power consumption. Small, inexpensive personal computers of the current generation feature computational bandwidths, capabilities, and capacities that greatly exceed those of high-end supercomputers of previous generations. The increase in computational bandwidth and capabilities is often attributed to a steady decrease in the dimensions of features that can be manufactured within integrated circuits, which increases the densities of integrated-circuit components, including transistors, signal lines, diodes, and capacitors, that can be included within microprocessor integrated circuits.

The rapid evolution of computers and computer systems has also been driven by enormous advances in computer programming and in many of the other hardware components of computer systems. For example, the capabilities and capacities of various types of data-storage components, including various types of electronic memories and mass-storage devices, have increased, in many cases, even more rapidly than those of microprocessor integrated circuits, vastly increasing both the computational bandwidths as well as data-storage capacities of modern computer systems.

Currently, further decrease in feature size of integrated circuits is approaching a number of seemingly fundamental physical constraints and limits. In order to reduce feature sizes below 20 nanometers, and still produce reasonable yields of robust, functional integrated circuits, new types of integrated-circuit architectures and manufacturing processes are being developed to replace current architectures and manufacturing processes. As one example, dense, nanoscale circuitry may, in the future, be manufactured by employing self-assembly of molecular-sized components, nano-imprinting, and additional new manufacturing techniques that are the subjects of current research and development. Similarly, the widely used dynamic random access memory ("DRAM") and other types of electronic memories and mass-storage devices and media may be, in the future, replaced with newer technologies, due to physical constraints and limitations associated with further decreasing the sizes of physical memory-storage features implemented according to currently available technologies. Researchers, developers, and manufacturers of electronic memories and mass-storage devices continue to seek new technologies to allow for continued increase in the capacities and capabilities of electronic memories and mass-storage devices while continuing to decrease the cost and power consumption of electronic memories and mass-storage devices.

BRIEF DESCRIPTION OF THE DRAWINGS

FIG. 1 illustrates one type of PCRAM physical memory cell.

FIG. 2 illustrates a method for accessing information stored within the example PCRAM memory cell shown in FIG. 1.

FIG. 3 illustrates the process of storing data into the example PCRAM memory cell shown in FIG. 1.

FIGS. 14A-B illustrate a memory-type hierarchy within a generalized computer system and associated average elapsed times between accesses to the various types of memory types.

DETAILED DESCRIPTION

Figure 4A:
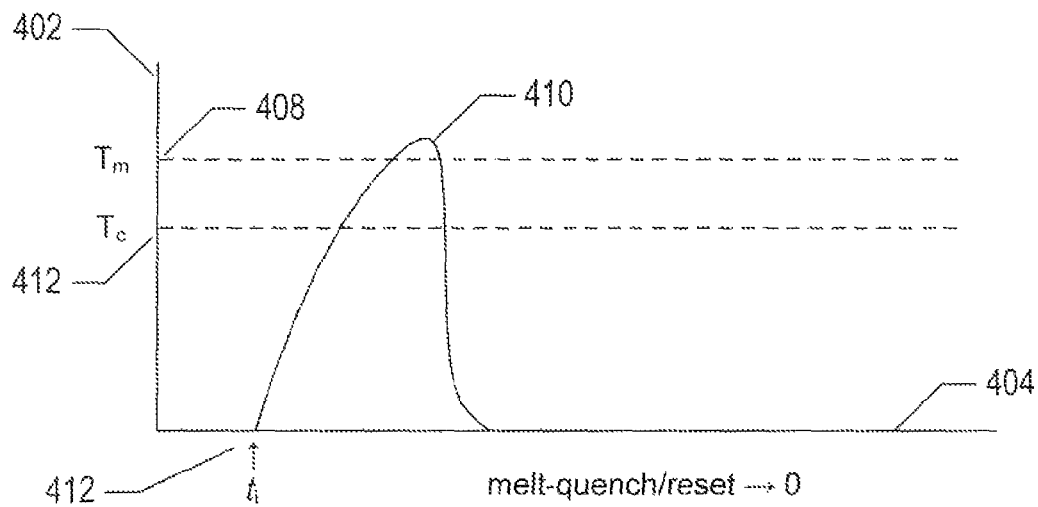
FIGS. 4A-C illustrate the RESET, SET, and READ operations carried out on a PCRAM memory cell.

This application is directed to various different types of memory devices and memory-device controllers. In the following discussion, phase-change random-access memories ("PCRAMs") are used as examples that include hardware and logic which allow the endurance: and retention characteristics of the PCRAMs to be dynamically adjusted after manufacture. In these PCRAM examples, the current density or voltage applied to a memory cell in order to change a physical state of the memory cell, and the duration of application of the current density or voltage, are dynamically adjusted in order to provide different levels of endurance and retention times for the memory cell. Dynamic adjustment of endurance and retention characteristics is employed to adapt PCRAM characteristics, at various different granularities within a PCRAM device, to a particular application of the PCRAM device. Dynamic adjustment of the voltages and currents applied to memristive memory cells and other types of memory cells and memory devices can also provide for post-manufacture adjustment of the endurance, and retention characteristics of these alternative types of memory cells and memory devices as additional examples. The following discussion includes five subsections: (1) an overview of PCRAM memory cells; (2) an overview of memory types and characterizations; (3) an overview of resiliency techniques for ameliorating memory-cell and component failures; (4) a discussion of memory-type hierarchies; and (5) a discussion of example embodiments.

Overview of PCRAM Memory Cells

FIG. 1 illustrates one type of PCRAM physical memory cell. The cell 100 includes a top 102 and a bottom 104 electrode, an inverted-pedestal-and-column-like volume of a phase-change material 106, and an access device 108 comprising a diode, field-effect transistor, or bipolar-junction transistor for controlling and minimizing leakage current. In general, a large number of PCRAM memory cells are fabricated together within a two-dimensional or three-dimensional array. The top electrode 102 and bottom electrode 104 correspond to portions of a bit line and word line, discussed below, within the two-dimensional or three-dimensional array. Each bit line and word line electrically interconnect multiple PCRAM cells with a bit-line decoder and word-line decoder, respectively. The electrodes generally comprise thin strips of conductive metallic, semi-conductor, or organic films.

The phase-change material is a material with two or more different, stable, and electrically selectable resistivity states. One type of phase-change material is referred to as a "chalcogenide glass" and features a relatively high-resistivity amorphous phase and a relatively low-resistivity crystalline phase. Example chalcogenide glasses include $Ge_2Sb_2Te$, $Ge_2Sb_2Te_5$, nitrogen-doped $Ge_2Sb_2Te_5$, $Sb_2Te$, Ag-doped $Sb_2Te$, and In-doped $Sb_2Te$, where Ge is the two-character chemical, symbol for germanium, Sb is the two-character chemical symbol for antimony, Te is the two-character chemical symbol for tellurium, Ag is the two-character chemical symbol for silver, and In is the two-character chemical symbol for indium. In general, the inverted-pedestal-and-column-like volume of phase-change material 106 and the access device 108 are embedded in an insulator that fills the volume, including the memory cells, between the top and bottom electrodes 102 (top) and 104 (bottom).

FIG. 2 illustrates a method for accessing information stored within the example PCRAM memory cell shown in FIG. 1. The resistivity of the phase-change material 106 within the PCRAM memory cell can be determined by applying an electrical potential across the phase-change material and access device 108 and measuring, by a voltage-differential sensor 202, the drop in potential across the PCRAM memory cell. Additional methods for accessing information stored in PCRAM memory cells in PCRAM memory-cell arrays are discussed below, in greater detail.

FIG. 3 illustrates the process of storing data into the example PCRAM memory cell shown in FIG. 1. As mentioned above, the phase-change material features at least two different resistivity states. A first, crystalline phase 302 has relatively low resistivity and, according to one convention, represents the binary value "1" 304. A second, amorphous phase 306 has relatively high resistivity and is associated with the binary value "0" 308 according to the convention. Of course, the assignment of material phases or phases to, represent numeric values is arbitrary, and a different convention can be used. In the crystalline phase, the atoms of the phase-change material are regularly ordered within a three-dimensional lattice 310. In the amorphous phase, the atoms of the phase-change material are disordered 312, generally exhibiting local order, within the neighborhood of individual atoms, but generally exhibiting no long-range order, as in the crystalline phase. The crystalline phase 302 is thermodynamically more favored, and has lower internal energy, than the amorphous phase 306.

Raising the chalcogenide phase-change material slightly above a crystallization temperature, $T_c$, and holding the phase-change material at that temperature for a period of time results in crystallization of the phase-change material. Thus, as shown by arrow 314 in FIG. 3, a PCRAM memory cell can be set to binary value "1" by raising the internal temperature of the phase-change material slightly above $T_c$ for a period of time. The phase-change material can be placed into the amorphous phase by raising the temperature of the phase-change material above a higher melting temperature, $T_m$, for a brief period of time and by then allowing the temperature to quickly decrease, trapping phase-change-material atoms in a glass-like, amorphous phase. The rapid decrease in temperature from $T_m$ is referred to as "quenching." Thus, as represented by arrow 316 in FIG. 3, the data contents of an example PCRAM memory cell can be reset to the binary value "0" by raising the temperature of the phase-change material above $T_m$ and by then quenching the phase-change material.

Of course, applying temperature $T_m$ and subsequent quenching to a PCRAM memory cell already in the amorphous phase does not change the data value stored in the PCRAM memory cell, and applying temperature $T_c$ to a PCRAM memory cell storing binary value "1" does not change the data value stored within the cell. Note that, in FIG. 3, the volume of phase-change material in the amorphous phase is shown as a mushroom-like volume that includes the lower rectangular column 320 and a mushroom-cap-like hemispherical volume 322 within the larger pedestal region 324. The mushroom-like amorphous volume is sufficient to change the resistance of the PCRAM memory cell sufficiently to allow the difference in resistivities between the crystalline and amorphous phases to be detected. As a further note, while two bi-stable resistivity states are sufficient for a binary PCRAM memory cell that stores either binary value "0" or "1," certain types of phase-change material and PCRAM memory-cell architectures result in multiple, stable, and detectable intervening resistivity states. As one example, certain prototype PCRAM memory cells feature 16 different stable resistivity states, so that a single memory cell is able to store four bits of information.

Figure 4B:
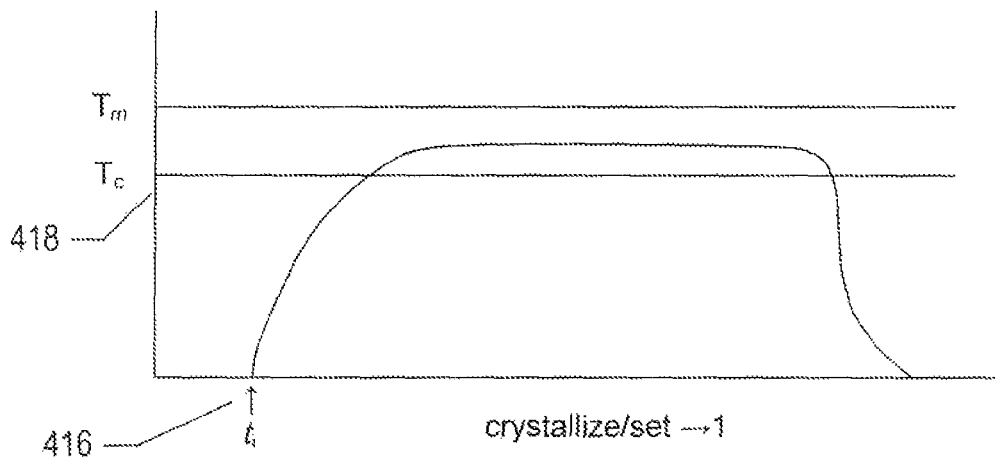
Figure 4C:
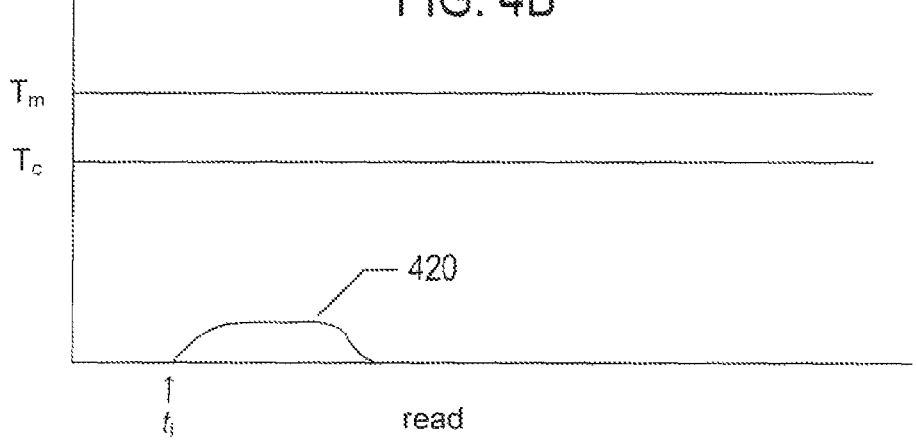

FIGS. 4A-C illustrate the RESET, SET, and READ operations carried out on a PCRAM memory cell. FIGS. 4A-C all use the same illustration conventions, next described with reference to FIG. 4A. FIG. 4A shows a graph in which a vertical axis 402 corresponds to the internal temperature of the phase-change material within a PCRAM memory cell and the horizontal axis 404 represents time. The RESET, or melt-quench, operation discussed above with reference to FIG. 3 is illustrated in FIG. 4A. At an initial point in time $t_i$ 406, a sufficiently large current density is developed within the phase-change material of the PCRAM memory cell to briefly raise the internal temperature above the melt temperature $T_m$ 408 to a temperature peak 410, after which the current density is quickly dropped to 0, as a result of which the temperature quickly decreases below the crystallization temperature $T_c$ 412. Thus, the RESET operation is carried out by passing a relatively brief current pulse through the phase-change material, resulting in a brief temperature spike within the phase-change material. The RESET operation can be carried out over a time period on the order of a fraction of a nanosecond, a nanosecond, or several nanoseconds, depending on the memory-cell geometry and phase-change material.

FIG. 4B shows, using the same illustration conventions as used in FIG. 4A, the SET operation which transforms the phase-change material to a crystalline phase. As shown in FIG. 4B, a relatively longer-duration current pulse is applied to the phase-change material, beginning at initial time $t_i$ 416, resulting in the internal temperature of the phase-change material exceeding the crystallization temperature $T_c$ 418 and remaining above $T_c$ for a period of time, generally on the order of tens of nanoseconds.

FIG. 4C illustrates, using the same illustration conventions as used in FIGS. 4A-B, the READ data-access operation carried out on a PCRAM memory cell. In order to read the data contents of the PCRAM memory cell, a relatively modest potential is applied to the phase-change material, which results in a very modest rise in temperature for a relatively brief period, as represented by temperature pulse 420. The applied voltage used to determine the resistivity state of the phase-change material results in a temperature increase within the phase-change material far below the crystallization temperature $T_c$. Thus, the voltage applied to the PCRAM memory cell in order to determine the data state of the memory cell does not change the physical state, or phase, of the phase-change material. The temperature rise in a crystalline-phase phase-change material is significantly less, for an applied voltage, than in an amorphous-phase phase-change material of the same composition, dimensions, and shape.

Figure 5:
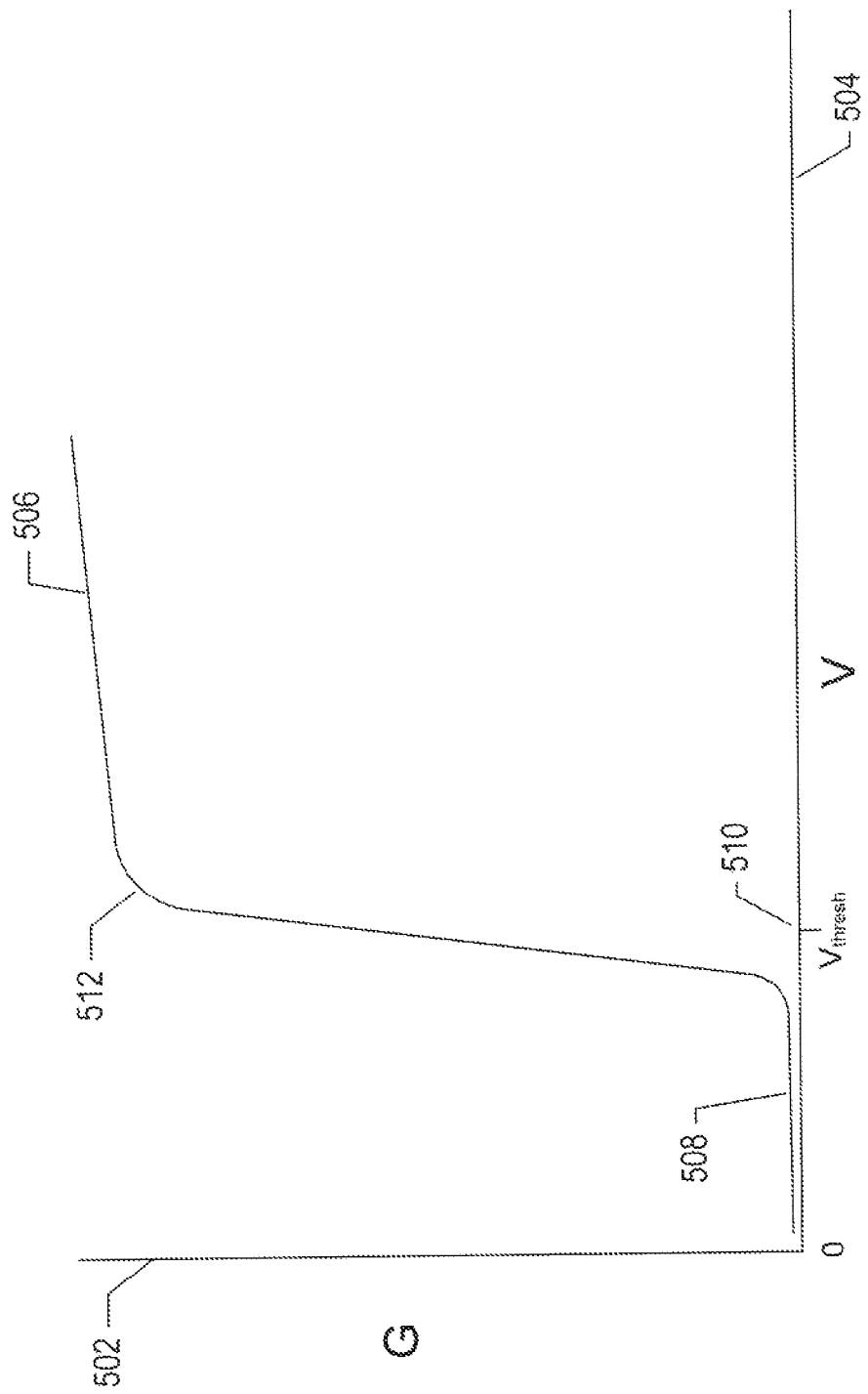
FIG. 5 illustrates the non-linear conductance properties of the phase-change material within a PCRAM memory cell that contribute to the ability to quickly and non-destructively apply the SET and RESET operations to the PCRAM memory cell.

FIG. 5 illustrates the non-linear conductance properties of the phase-change material within a PCRAM memory cell that contribute to the ability to quickly and nondestructively apply the SET and RESET operations to the PCRAM memory cell. In FIG. 5, the conductance of the phase-change material is represented by vertical axis 502 and the voltage applied to the PCRAM memory cell is represented by horizontal axis 504. Curve 506 shows the conductance G of the phase-change material as a function of the voltage applied to the phase-change material in a non-crystalline, amorphous phase. Initially, as the voltage applied to the phase-change material increases from 0 volts, the conductance remains low, as represented by the initial, nearly horizontal portion 508 of the conductance/voltage curve 506. However, near an applied voltage $V_{thresh}$ 510, the conductance rapidly increases to a relatively large conductance 512. This rapid increase in conductance facilitates rapid development of a relatively high current density within the phase-change material during the SET and RESET operations, so that the internal temperature of the phase-change material can be quickly placed above $T_m$, as shown in FIG. 4A.

Overview of Memory Types and Characterizations

Figure 6:
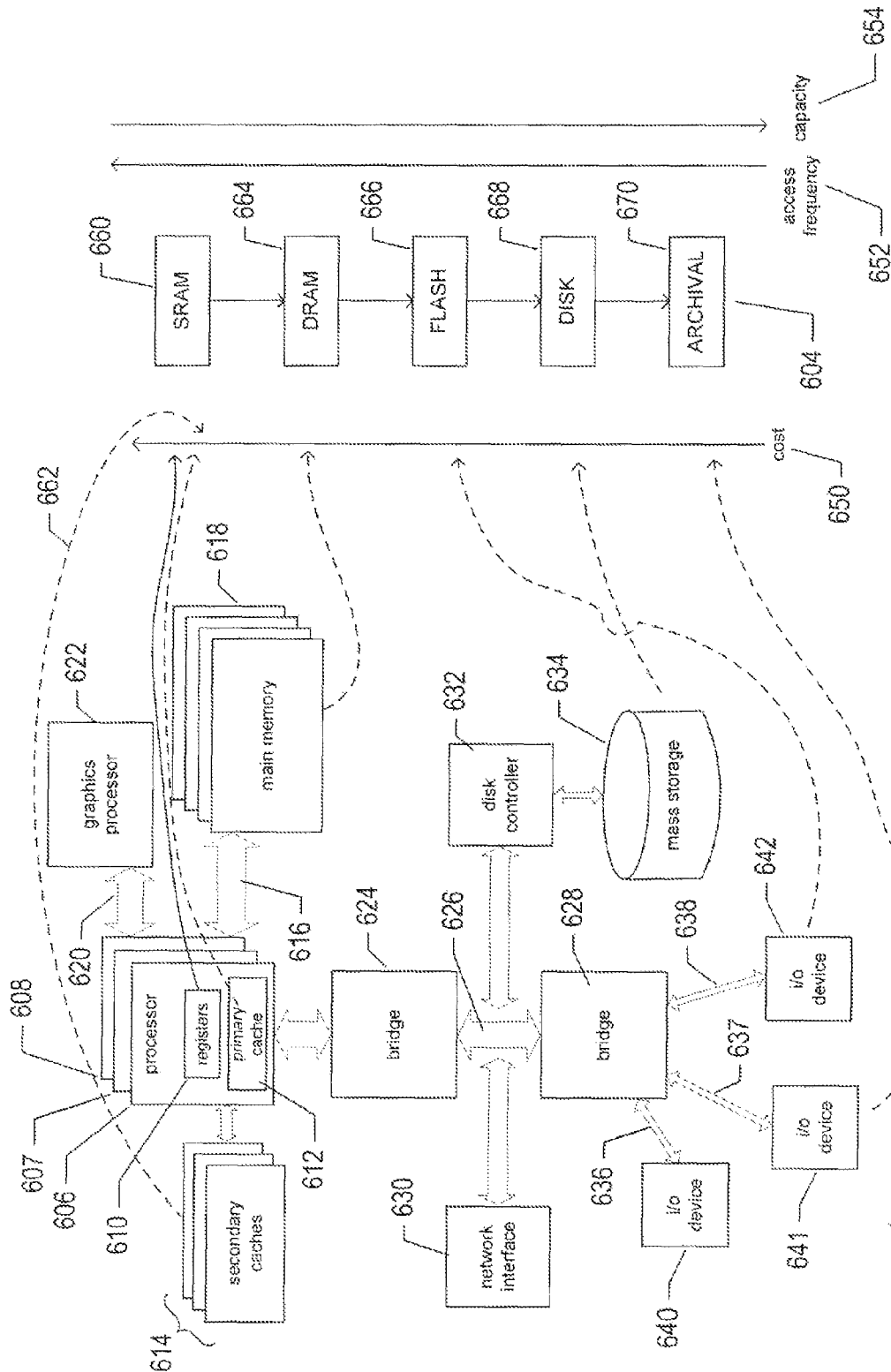
FIG. 6 illustrates the various different types of memories used within a computer system.

FIG. 6 illustrates the various different types of memories used within a computer system. The left-hand portion 602 of FIG. 6 shows a high-level representation of various components of a modern computer system, and the right-hand portion 604 of FIG. 6 illustrates a hierarchy of memory types. The computer-system components include one or more processor integrated circuits 606-608, each of which includes processor registers 610, a form of electronic memory, and a primary memory cache 612, another form of electronic memory. Each processor accesses one or more additional memory caches 614, a third type of electronic memory. The processors are connected, via a memory bus 616, to main memory 618, generally comprising a large number of dynamic-random-access-memory ("DRAM") integrated circuits.

One or more processors are also interconnected, through a graphics bus 620 to a specialized graphics processor 622 that controls processing of information transmitted to a graphical display device. The processors are interconnected, through a bridge integrated circuit 624 to a high-bandwidth internal communications medium 626, such as a parallel/serial PCIe communications medium, to a second bridge 628, a network interface 630, and an internal hard-drive controller 632. The network interface 630, comprising, one or more integrated circuits mounted to a small printed circuit board ("PCB"), provides an interface to a network communications medium, such as an Ethernet, and the disk controller 632, also implemented by one or more integrated circuits mounted to a PCB, provides an interface to mass-storage devices 634, such as magnetic-disk-based mass-storage devices. The second bridge 628 interfaces, generally through lower-speed interconnects 636-638, to various lower-bandwidth input/output ("I/O") devices 640-642, such as keyboards and other input and output devices, as well as to a variety of peripheral devices.

As shown on the right-hand side 604 of FIG. 6, various different types of memory technologies can be ordered according to cost 650, access frequency 652, and data-storage capacity 654, among other characteristics. The most expensive, most frequently accessed, and lowest-capacity type of memory is static random access memory ("SRAM") 660. As indicated by dashed arrows, such as dashed arrow 662, SRAM memory is generally used for on-board registers within integrated circuits, such as the registers 610 within the processor integrated circuits, as well as for on-board primary cache 612 and various levels of secondary caches 614. Registers and cache memories are frequently accessed, with the mean time between accesses to a particular data-storage unit on the order of nanoseconds to tens of nanoseconds. In order to provide sufficiently rapid access operations to support these access rates, relatively expensive implementations are employed. The implementations also involve relatively large footprints for memory-storage cells which, along with the high expense, limit the overall capacity of the SRAM integrated circuits.

Lower cost, less-frequently accessed, but higher-capacity DRAM integrated circuits 664 are employed for main memory. DRAM memory cells are relatively simpler, with memory cells having smaller footprints than SRAM memory cells, increasing the density of memory cells within DRAM integrated circuits relative to SRAM integrated circuits. Both SRAM and DRAM memories are volatile. The data stored within SRAM and DRAM integrated circuits is lost when the integrated circuits are powered down. By contrast, flash memory 666 is non-volatile, with stored data maintained over power-on and power-off cycles. Flash memory is employed within small USB solid-state drives, for non-volatile storage of software in embedded computing devices, and for many other purposes. Magnetic disk drives and solid-state disk drives 668 are used for user and system files and for storing virtual-memory pages. The cost per stored byte for disk drives is generally significantly less than that for DRAM and SRAM technologies. The storage capacity of disk drives generally exceeds the storage capacity of SRAM and DRAM integrated circuits, but access times are much longer. Therefore, disk storage is more suited to storing data that needs to be accessed much less frequently than processor registers, primary and secondary memory caches, and main memory. Finally, various different types of archival mass-storage memory 670 may be included in, or accessed by, a computer system, including optical disks, magnetic tape, and other types of very inexpensive memory with generally very low access frequencies.

Figure 7:
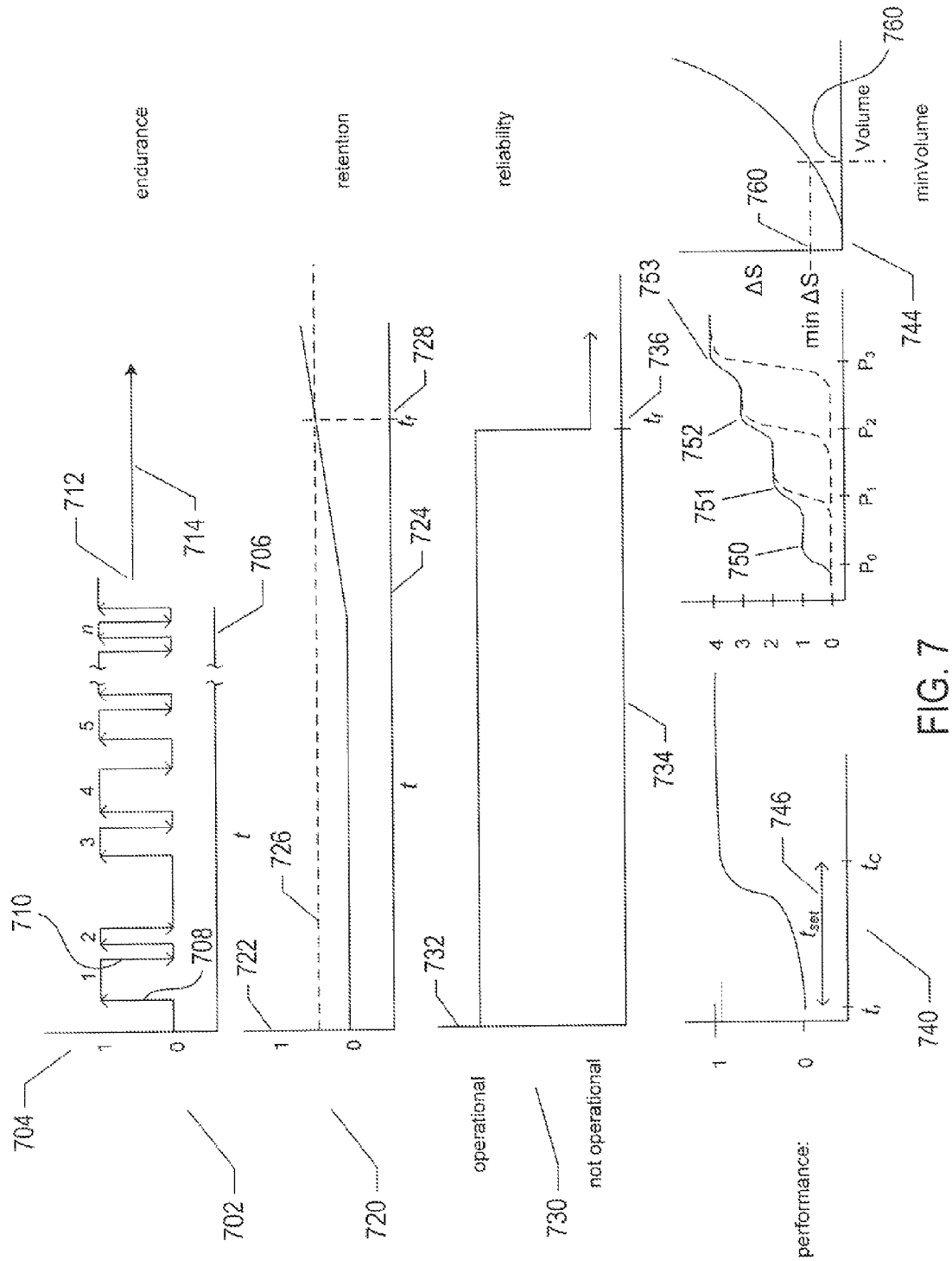
FIG. 7 illustrates various different characteristics associated with different types of memory.

FIG. 7 illustrates various different characteristics associated with different types of memory. These characteristics are illustrated in graphical form. One characteristic of a memory technology is the endurance of the data-storage units, such as memory cells, within the memory. The endurance is represented, in FIG. 7, by graph 702, the vertical axis of which 704 represents the data value stored in a memory element, either "0" or "1," and the horizontal axis of which 706 represents time. Over the course of time, a value stored in a memory element may change from "0" to "1," as represented by upward-pointing vertical arrows, such as vertical arrow 708, and may change from "1" to "0," as represented by downward-pointing vertical arrows, such as arrow 710. Pairs of adjacent upward-pointing and downward-pointing arrows define stored-data-value cycles. The endurance that characterizes memory cells of a particular memory technology can be thought of as the average number of data-value-storage cycles through which the memory cell can be cycled before the memory cells fails or degrades to the point that the physical state of the memory cell can no longer be changed or the particular data state that the memory cell inhabits can no longer be detected, represented in the graph 702 as the point 712 from which a flat, horizontal line 714 emanates. The memory cell represented by graph 702 is successfully cycled n times prior to failure, so the cell exhibits an endurance of n cycles. The variability of the number of cycles prior to failure may also be a parameter for memory technologies.

Another characteristic of memory technologies, retention, is illustrated in graph 720, in which the vertical axis 722 represents the data state of a memory cell and the horizontal axis 724 represents time. As discussed above, for a PCRAM memory cell, the amorphous "0" phase is thermodynamically unstable with respect to the crystalline phase. Over time, even at ambient temperatures well below $T_c$, the crystallization temperature, the amorphous phase tends to relax to the crystalline phase, or drift. Thus, as shown in graph 720 of FIG. 7, a memory cell initially in phase "0," over time, begins to drift towards an intermediate phase, represented by horizontal dashed line 726, with a resistivity that is not sufficiently distinct from the resistivity of the amorphous phase or the resistivity of the crystalline phase to allow the data state of the memory cell to be determined to a reasonable degree of certainty. The retention time 728 for the memory cell is the time that elapses as the memory cell drifts from the amorphous phase to an intermediate phase for which the data state of the memory cell cannot be determined to a reasonable level of certainty.

The reliability of a memory technology may be expressed in various different ways, including graph 730 in FIG. 7, in which the vertical axis 732 represents the operational state of the memory cell and the horizontal axis 734 represents time. In graph 730, a memory cell is initially operational and continues to be operational until a point in time 736 at which the memory cells fails. Memory cells may fail for a variety of different reasons. For example, in a PCRAM memory cell, the phase-change material may expand and contract during heating and quenching, as a result of which the phase-change material may, at some point, physically separate from the overlying or underlying electrical contacts within the phase-change memory cell. When such separation occurs, the resistance of the memory cell may become quite large, and the memory cell may not be able to be returned to a low-resistance state by a normal SET operation. Note that the reliability characteristic is somewhat different, but related to, endurance.

Various other characteristics of memory technologies may be lumped together under the category "performance." As shown by graphs 740, 742, and 744 in FIG. 7, performance characteristics may include the latency 746 for a SET operation, the number of stable resistivity states into which a memory cell can be placed and which can be reliably detected 750-753, and the minimum volume 760 of phase-change material needed to produce a sufficient difference in resistivity or other measurable characteristic 762 to allow the volume of phase-change material to represent a stored data value.

Figure 8:
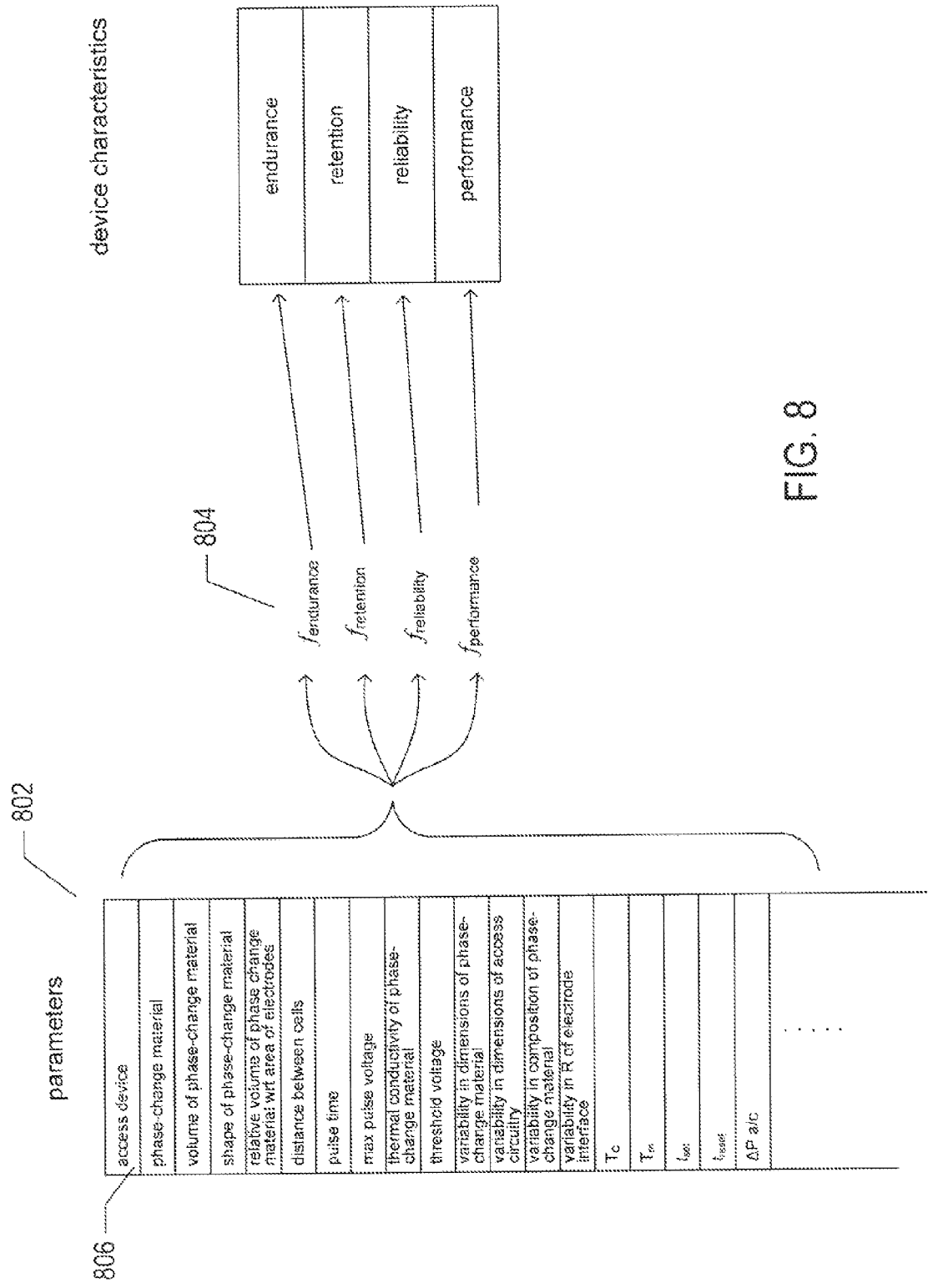
FIG. 8 shows the interdependence of various memory-technology parameters and the various device characteristics discussed with reference to FIG. 7.

FIG. 8 shows the interdependence of various memory-technology parameters and the various device characteristics discussed with reference to FIG. 7. As shown in FIG. 8, there are a large number of parameters that characterize a particular memory technology, such as the PCRAM memory technology 802. These parameters are not necessarily independent from one another and thus do not necessarily represent orthogonal dimensions of some parameter space. As shown in FIG. 8, the parameters associated with a PCRAM memory technology include: the type of access device included in a memory cell; the chemical composition of the phase-change material; the volume of phase-change material included in a memory cell; the shape of the volume of phase-change material used in the memory cell; the relative volume of the phase-change material with respect to the area of the electrodes or other conductive features with which the volume of phase-change material is in contact; the distance between adjacent memory cells in a memory array; the pulse time used for the RESET operation; the maximum voltage or maximum current density produced within the phase-change material during a RESET operation; the thermal conductivity of the phase-change material; the threshold voltage of the phase-change material; the variability in the dimensions of the volume of phase change material across an array of memory elements; similar variability in the dimensions of the access circuitry, the chemical composition of the phase-change material, and in the resistance of the electrode interfaces to the phase-change material; the crystallization and melt temperatures, $T_c$ and $T_m$; the write-access latencies $T_{set}$ and $T_{reset}$; the difference in resistivity between the amorphous and crystalline phases; and many other parameters and characteristics.

Each of the broad device characteristics discussed with reference to FIG. 7 can be viewed as functions 804 of the various memory-cell parameters or subsets of those parameters. For example, the parameter access-device type 806 may influence the endurance of a memory cell because different access devices may have different footprints and surface areas, with larger access-device surface areas requiring greater current densities to achieve $T_c$ and $T_m$ within the phase-change materials and with higher current densities related to increased likelihood of certain failure modes.

Figure 9:
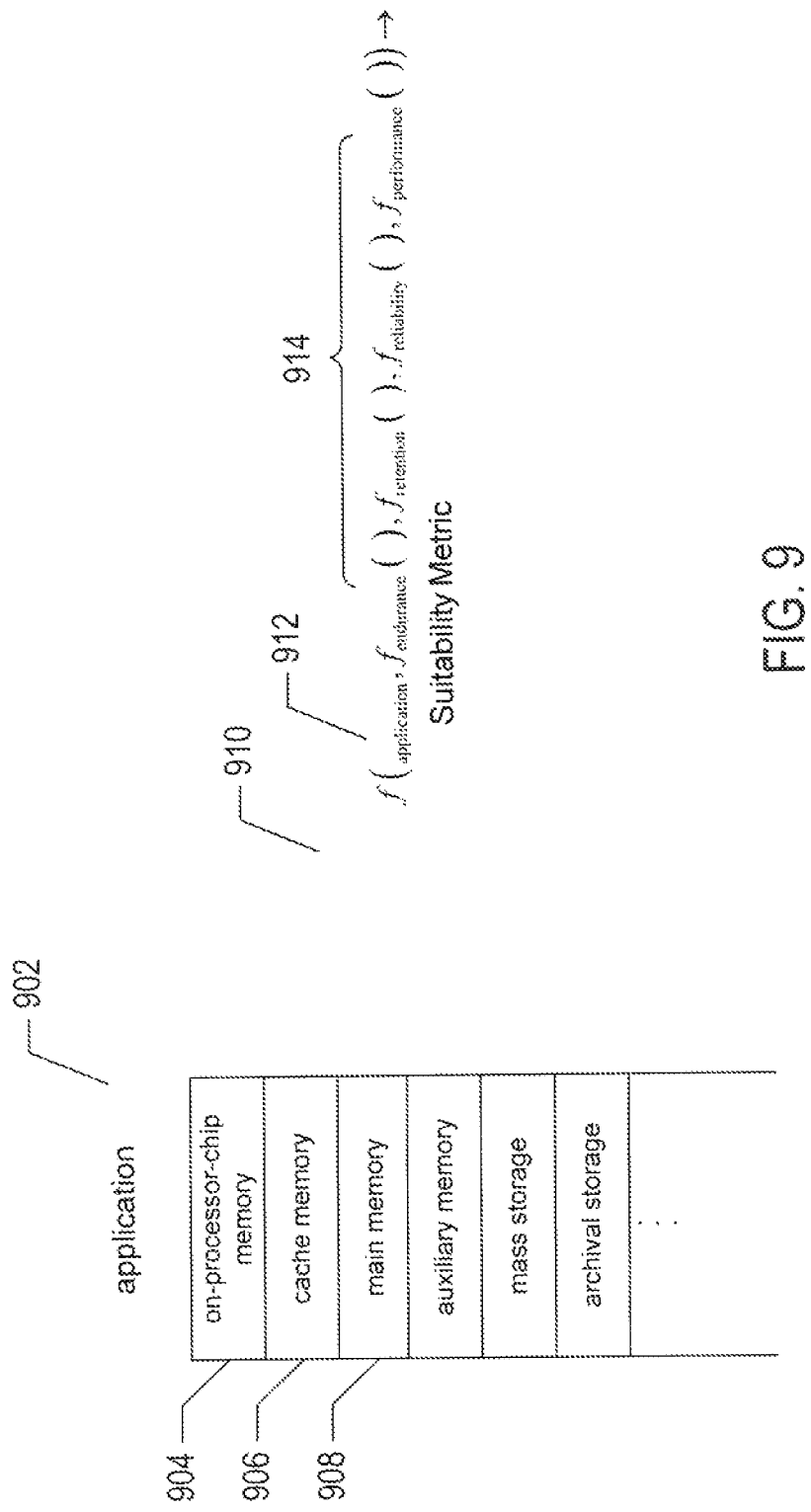
FIG. 9 illustrates the process of considering whether a particular memory technology is suitable for a particular application.

FIG. 9 illustrates the process of considering whether a particular memory technology is suitable for a particular application. As shown in FIG. 9 in column 902 and as discussed above, a particular memory technology may be considered for use for a variety of different applications, including on-board registers and caches 904, separate cache memory 906, main memory 908, and a variety of other applications. One can imagine a function 910 which takes, as parameters, the particular application 912 for which a memory technology is to be used and the various characteristics 914 associated with the memory technology, and which returns a suitability metric that indicates how well the memory technology is suited for the particular application. As discussed with reference to FIG. 8, however, each of the broad memory-technology characteristics, such as endurance, retention, and reliability, is generally a function of a large number of different memory-technology parameters. Certain of these parameters are fixed by the manufacturing process and certain other of the parameters may reflect dynamic, operational conditions and other post-manufacturing phenomena. In general, determining whether or not a particular memory technology is, or can be made, suitable for a particular application, and optimizing a particular memory technology for a particular application, may be quite complex.

Overview of Resiliency Techniques for Ameliorating Memory-Cell and Component Failures Endurance and retention characteristics are often considered to be primarily dependent on the phase-change material and architecture of the memory cell. Reliability of memory devices, while depending on the materials and architectures of the devices, may also be increased by various post-manufacturing resiliency techniques. While failure of memory cells may lead to unrecoverable data corruption in memory devices, there are many different resiliency techniques that can be employed to ameliorate up to threshold levels of individual memory-cell failures. In memory devices that allow multi-bit data units, such as 64-bit or 128-bit words, to be stored and retrieved, a certain number of redundant, additional bits can be prepended or appended to the data bits, to facilitate, detection of up to a threshold number of corrupted data bits and correction of a smaller-threshold number of corrupted data bits. This technique is referred to as error-control encoding. On a larger scale, memory devices can mirror stored data or can employ erasure-coding schemes, such as those employed in the redundant array of independent disks ("RAID") technologies, to provide sufficient redundant storage to recover even from subcomponent failures.

Error-control encoding techniques systematically introduce supplemental bits or symbols into plain-text messages, or encode plain-text messages using a greater number of bits or symbols than required, in order to provide information in encoded messages to allow for errors arising in storage or transmission to be detected and, in some cases, corrected. A data-storage unit, such as a 128-bit word, can be viewed as a message. One effect of the supplemental or more-than-absolutely-needed bits or symbols is to increase the distance between valid codewords, when codewords are viewed as vectors in a vector space and the distance between codewords is a metric derived from the vector subtraction of the codewords.

In describing error detection and correction, it is useful to describe the data to be transmitted, stored, and retrieved as one or more messages, where a message $\mu$ comprises an ordered sequence of symbols, $\mu_i$, that are elements of a field F. A message $\mu$ can be expressed as:

$$\mu = (\mu_0, \mu_1, \ldots \mu_{k-1})$$

where $\mu_i \in F$.

In practice, the binary field GF(2) or a binary extension field GF($2^m$) is commonly employed. Commonly, the original message is encoded into a message c that also comprises an ordered sequence of elements of the field GF(2), expressed as follows:

$$c = (c_0, c_1, \ldots c_{n-1})$$

where $c_i \in GF(2)$.

Block encoding techniques encode data in blocks. In this discussion, a block can be viewed as a message $\mu$ comprising a fixed number of k symbols that is encoded into a message c comprising an ordered sequence of n symbols. The encoded message c generally contains a greater number of symbols than the original message $\mu$, and therefore n is greater than k. The r extra symbols in the encoded message, where r equals n−k, are used to carry redundant check information to allow for errors that arise during transmission, storage, and retrieval to be detected with an extremely high probability of detection and, in many cases, corrected.

The encoding of data for transmission, storage, and retrieval, and subsequent decoding of the encoded data, can be described as follows, when no errors arise during the transmission, storage, and retrieval of the data:

$$\mu \rightarrow c(s) \rightarrow c(r) \rightarrow \mu$$

where c(s) is the encoded message prior to transmission, and c(r) is the initially retrieved or received, message. Thus, an initial message p is encoded to produce encoded message c(s) which is then transmitted, stored, or transmitted and stored, and is then subsequently retrieved or received as initially received message c(r). When not corrupted, the initially received message c(r) is then decoded to produce the original message $\mu$. As indicated above, when no errors arise, the originally encoded message c(s) is equal to the initially received message c(r) and the initially received message c(r) is straightforwardly decoded, without error correction, to the original message $\mu$.

When errors arise during the transmission, storage, or retrieval of an encoded message, message encoding and decoding can be expressed as follows:

$$\mu(s) \rightarrow c(s) \rightarrow c(r) \rightarrow \mu(r)$$

Thus, as stated above, the final message $\mu(r)$ may or may not be equal to the initial message $\mu(s)$, depending on the fidelity of the error detection and error correction techniques employed to encode the original message $\mu(s)$ and decode or reconstruct the initially received message c(r) to produce the final received message $\mu(r)$. Error detection is the process of determining that:

$$c(r) \neq c(s)$$

while error correction is a process that reconstructs the initial, encoded message from a corrupted initially, received message:

$$c(r) \rightarrow c(s)$$

The encoding process is a process by which messages, symbolized as $\mu$, are transformed into encoded messages c. A word $\mu$ can be any ordered combination of k symbols selected from the elements of F, while a codeword c is defined as an ordered sequence of n symbols selected from elements of F via the encoding process:

$$\{c : \mu \rightarrow c\}$$

Linear block encoding techniques encode words of length k by considering the word $\mu$ to be a vector in a k-dimensional vector space and multiplying the vector $\mu$ by a generator matrix:

$$c = \mu \cdot G$$

The generator matrix G for a linear block code can have the form:

$$G_{k,n} = [P_{k,r} | I_{k,k}].$$

A code generated by a generator matrix in this form is referred to as a "systematic code." When a generator matrix having the first form, above, is applied to a word μ, the resulting codeword c has the form:

$$c = (c_0, c_1, \ldots, c_{r-1}, \mu_0, \mu_1, \ldots, \mu_{k-1})$$

where $c_i = \mu_0 p_{0,i} + \mu_1 p_{1,i} + \ldots + \mu_{k-1,i}$. Using a generator matrix of the second form, codewords are generated with trailing parity-check bits. Thus, in a systematic linear block code, the codewords comprise r parity-check symbols $c_i$ followed by the k symbols comprising the original word μ or the k symbols comprising the original word μ followed by r parity-check symbols. When no errors arise, the original word, or message μ, occurs in clear-text form within, and is easily extracted from, the corresponding codeword.

Error detection and correction involves computing a syndrome S from an initially received or retrieved message c(r):

$$S = (s_0, s_1, \ldots, s_{r-1}) = c(r) \cdot H^T$$

where $H^T$ is the transpose of the parity-check matrix. $H_{r,n}$, defined as:

$$H_{r,u} = [I_{r,r} | -P^T]$$

The syndrome S is used for error detection and error correction. When the syndrome S is the all-0 vector, no errors are detected in the codeword. When the syndrome includes bits with value "1," errors are indicated. There are techniques for computing an estimated error vector ê from the syndrome and codeword which, when added by modulo-2 addition to the codeword, generates a best estimate of the of the original message μ.

Data-storage devices and systems, including multi-component data-storage devices and systems, provide not only data-storage facilities, but also provide and manage automated redundant data storage, so that, when portions of stored data are lost, due to a component failure, such as disk-drive failure and failures of particular cylinders, tracks, sectors, or blocks on disk drives, in disk-based systems, failures of other electronic components, failures of communications media, memory-cell arrays, and other failures, the lost data can be recovered from redundant data stored and managed by the data-storage devices and systems, generally without intervention by device controllers, host computers, system administrators, or users.

Certain multi-component data-storage systems support at least two different types of data redundancy. The first type of data redundancy is referred to as "mirroring," which describes a process in which multiple copies of data objects are stored on two or more different components, so that failure of one component does not lead to unrecoverable data loss.

Figure 10:
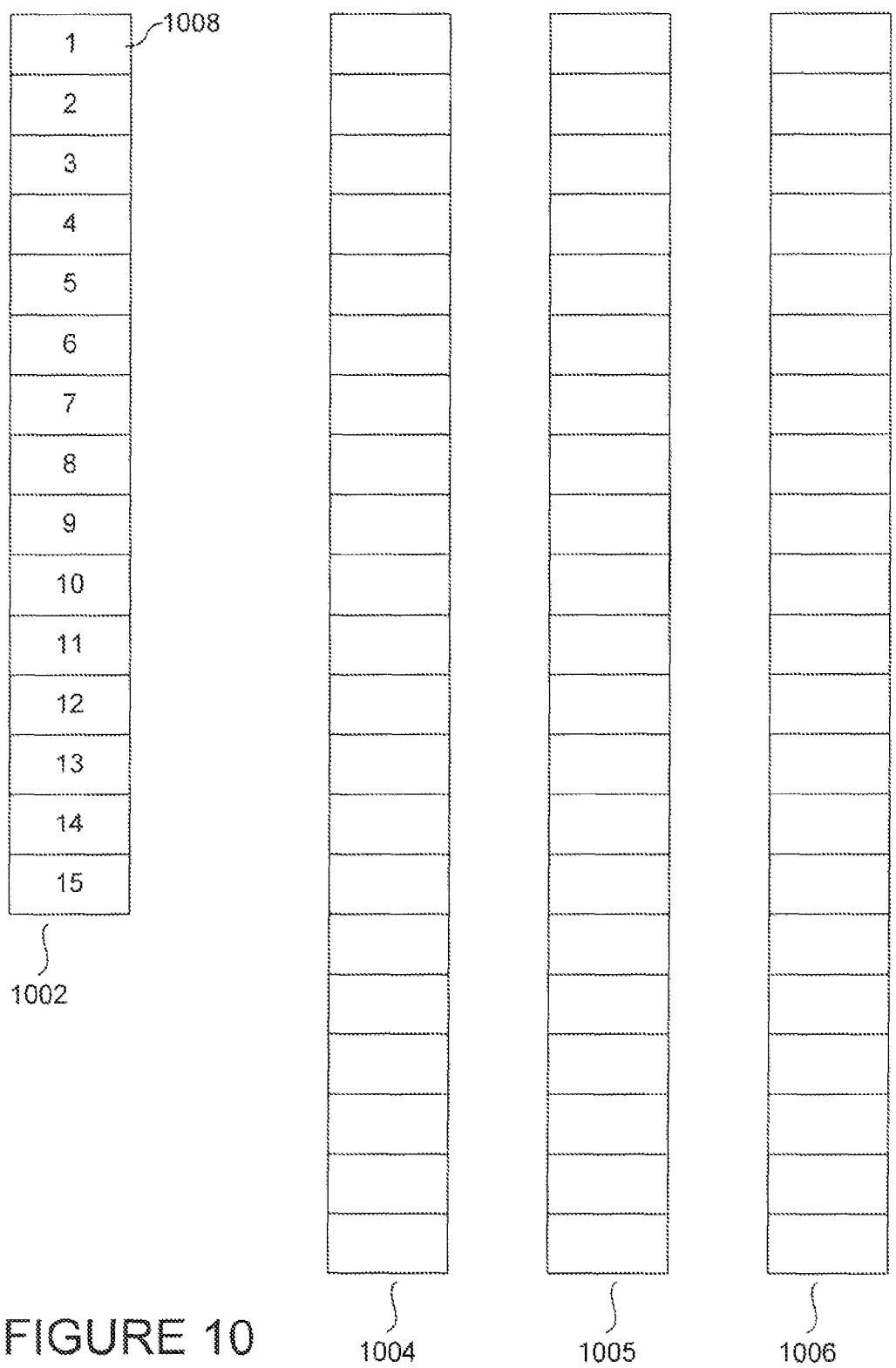
FIGS. 10-11 illustrate the concept of data mirroring.
Figure 11:
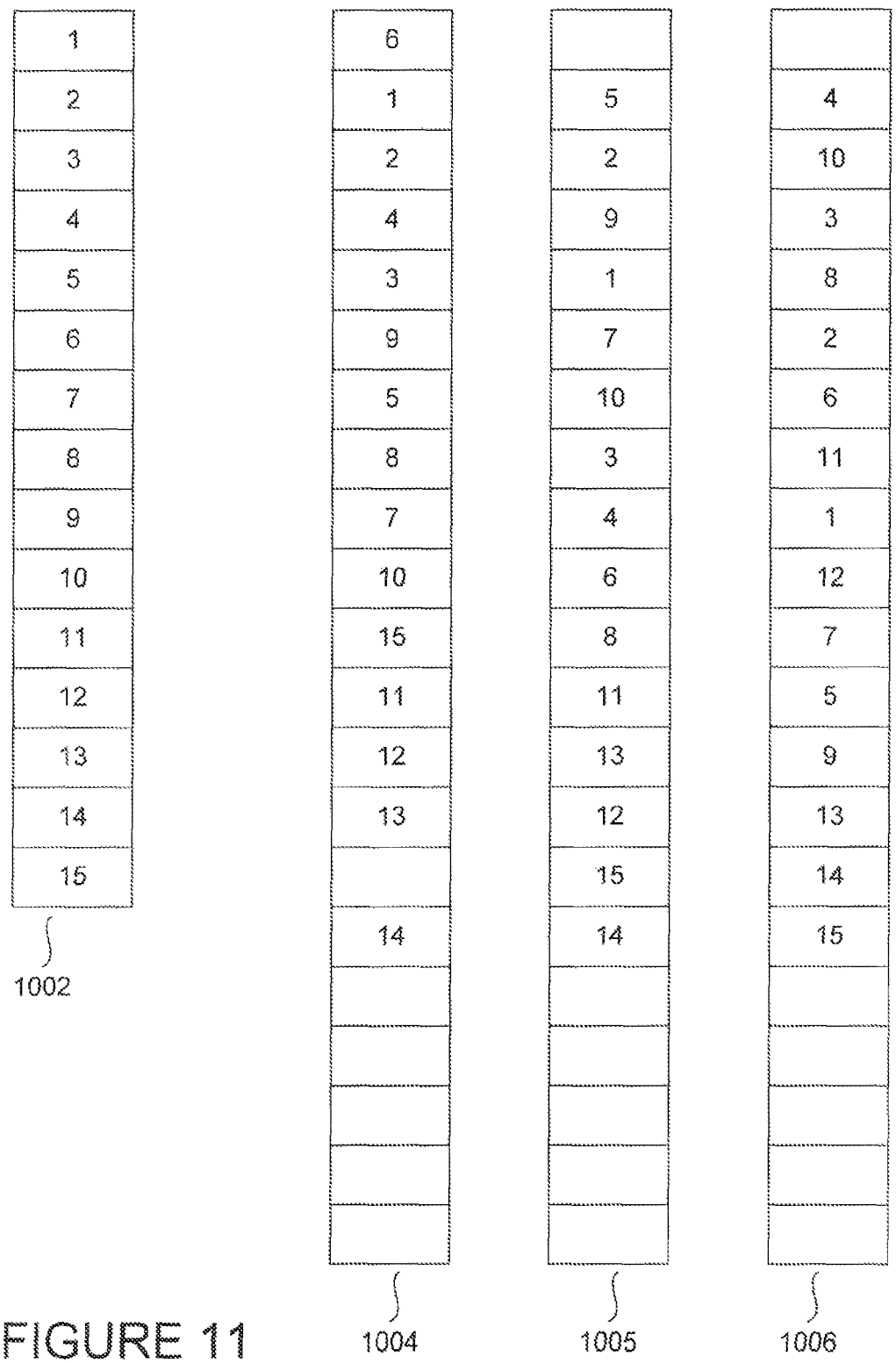

FIGS. 10-11 illustrate the concept of data mirroring. FIG. 10 shows a data object 1002 and a logical representation of a portion of the data contents of three components 1004-1006 of a data-storage system. The data object 1002 comprises 15 sequential data units, such as data unit 1008, numbered: "1" through "15" in FIG. 10. A data object may be a volume, a file, a data base, a memory page, or another type of data object, and data units may be words, blocks, pages, or other such groups of consecutively-addressed physical storage locations. FIG. 11 shows triple-mirroring redundant storage of the data object 1002 on the three components 1004-1006 of a data-storage system. Each of the three components contains copies of all 15 of the data units within the data object 1002. In many illustrations of mirroring, the layout of the data units is shown to be identical in all mirror copies of the data object. However, a component may choose to store data units anywhere on its internal data-storage sub-components, including disk drives.

In FIG. 11, the copies of the data units, or data pages, within the data object 1002 are shown in different orders and positions within the three different components. Because each of the three components 1004-1006 stores a complete copy of the data object, the data object is recoverable even when two of the three components fail. The probability of failure of a single component is generally relatively slight, and the combined probability of failure of all three components of a three-component mirror is generally extremely small. A multi-component data-storage system may store millions, billions, trillions, or more different data objects, and each different data object may be separately mirrored over a different number of components within the data-storage system.

A second type of redundancy is referred to as "erasure coding" redundancy or "parity encoding." Erasure-coding redundancy is somewhat more complicated than mirror redundancy. Erasure-coding redundancy often employs Reed-Solomon encoding techniques used for error-control coding of communication messages and other digital data transferred through noisy channels. These error-control-coding techniques use binary linear codes.

Figure 12:
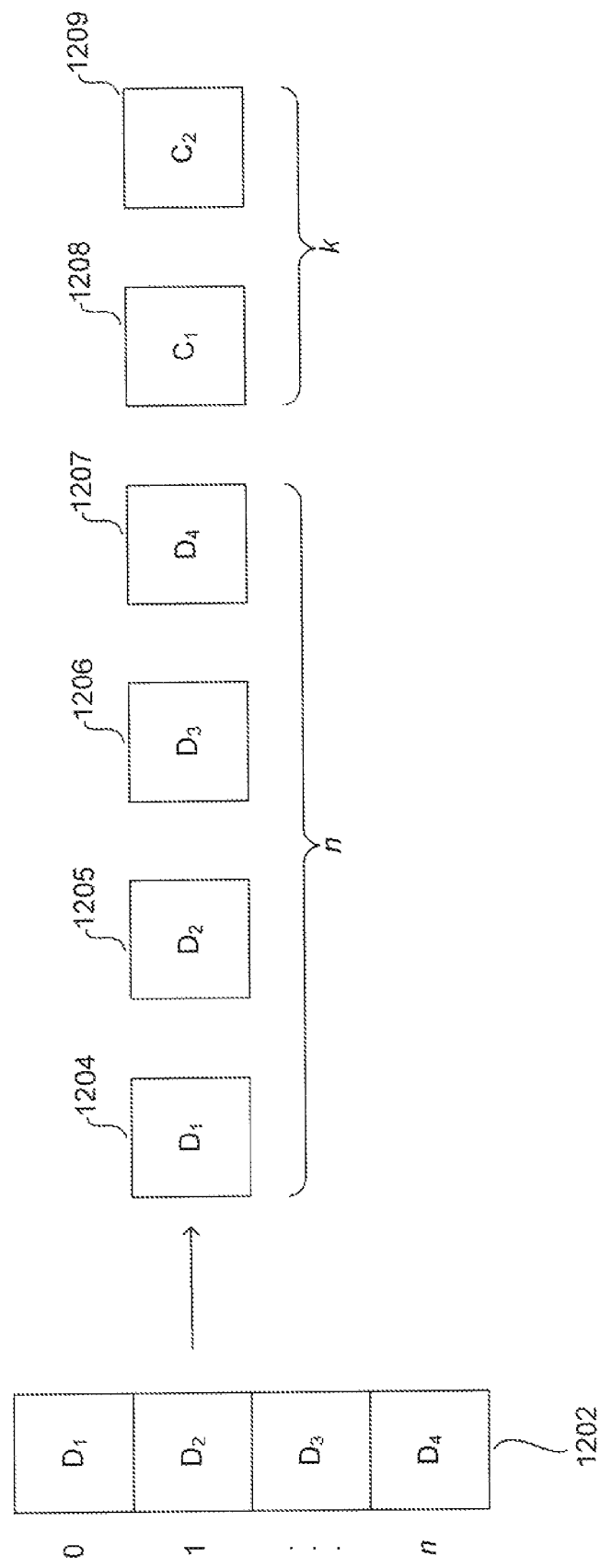
FIG. 12 shows a high-level diagram depicting erasure-coding-based data redundancy.

FIG. 12 shows a high-level diagram depicting erasure-coding-based data redundancy. In FIG. 12, a data object 1202 comprising n=4 data units is distributed across six different components 1204-1209. The first n components 1204-1207 each stores one of the n data units. The final k=2 components 1208-1209 store checksum, or parity, data computed from the data object. The erasure coding redundancy scheme shown in FIG. 12 is an example of an n+k erasure-coding redundancy scheme. Because n=4 and k=2, the specific n+k erasure-coding redundancy scheme is referred to as a "4+2" redundancy scheme. Many other erasure-coding redundancy schemes are possible, including 8+2, 3+3, 3+1, and other schemes. As long as k or less of the n+k components fail, regardless of whether the failed components contain data or parity values, the entire data object can be restored. For example, in the erasure coding scheme shown in FIG. 12, the data object 1202 can be entirely recovered despite failures of any pair of components, such as components 1205 and 1208.

Figure 13:
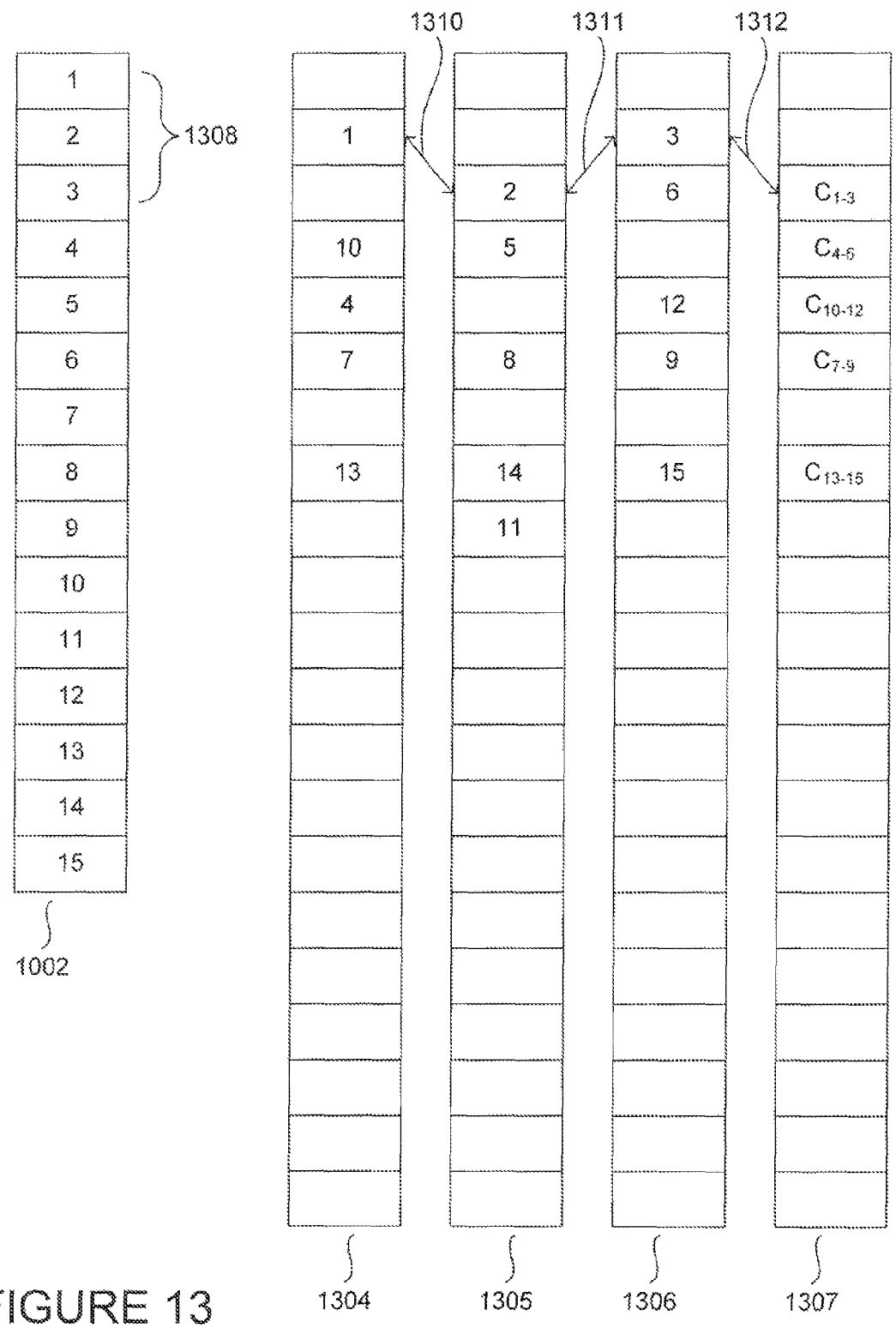
FIG. 13 shows an example 3+1 erasure-coding redundancy scheme using the same illustration conventions as used in FIGS. 10 and 11.

FIG. 13 shows an example 3+1 erasure-coding redundancy scheme using the same illustration conventions as used in FIGS. 10 and 11. In FIG. 13, the 15-data-unit data object 1002 is distributed across four components 1304-1307. The data units are striped across the four components, with each three-data-unit subset of the data object sequentially distributed across components 1304-1306, and a check sum, or parity, data unit for the stripe placed on component 1307. The first stripe, consisting of the three data units 1308, is indicated in FIG. 13 by arrows 1310-1312. Although, in FIG. 13, checksum data units are all located on a single component 1307, the stripes may be differently aligned with respect to the components, with each component containing some portion of the checksum or parity data units.

Erasure-coding redundancy is obtained by mathematically computing checksum or parity bits for successive sets of n bytes, words, or other data units, by methods conveniently expressed as matrix multiplications. As a result, k data units of parity or checksum bits are computed from n data units. Each data unit typically includes a number of bits equal to a power of two, such as 8, 16, 32, or a higher power of two.

Thus, in an 8+2 erasure, coding redundancy scheme, from eight data units, two data units of checksum, or parity bits, are generated, all of which can be included in a ten-data-unit stripe. In the following discussion, the term "word" refers to a granularity at which encoding occurs, and may vary from bits to longwords or data units of greater length.

Discussion of Memory-Type Hierarchies

FIGS. 14A-B illustrate a memory-type hierarchy within a generalized computer system and associated average elapsed times between accesses to the various types of memory. In FIG. 14A, the types of memory in the memory hierarchy are illustrated as address spaces, or blocks of contiguous data units, each associated with an address, and the addresses of adjacent data units increasing by a fixed increment. The types of memory include processor and other integrated-circuit registers 1402, various levels of on-board and external cache memory 1404-4406, main memory 1408, mass-storage memory 1410, and archival memory 1412. In a general-purpose computer system, a virtual-memory system, a component of the operating system for the general-purpose computer, extends the apparent address space of main memory 1408 by mapping memory pages from a portion of mass storage 1414 into main memory, on processor demand, and mapping pages from memory back to the portion of mass-storage space 1414. Thus, main memory becomes a kind of cache for the larger virtual-memory address space implemented as a combination of main memory and a portion of the mass-storage-device memory. A highest level of secondary cache 1406 serves as a cache for recently accessed main-memory data units, while lower-level secondary caches, such as cache 1405, serve as caches for most recently accessed cache lines of higher-level secondary memories, such as cache 1406. Ultimately, the on-board processor registers 1402 store data for direct manipulation by processor logic. The underlying premise is that the data stored closest to the registers, in the memory hierarchy, are most likely to be re-accessed, and are accessed most frequently. In a similar fashion, a second portion 1416 of the mass-storage address space is devoted to system and user files, which can, to a certain extent, be considered as a cache for a much larger amount of data stored in the archival memory 1412. As shown in FIG. 14B, the medium time between accesses to a particular data-storage unit of the various types of memory in the memory hierarchy increases from nanoseconds 1420 for processor registers up to years and decades 1422 for archival storage devices. A similar plot would show similar increase in the retention requirements for the various types of memory in the memory hierarchy. For example, a processor register may need a retention time on the order of a few tens of nanoseconds, while archival storage may need retention times on the order of decades or centuries.

Figure 15A:
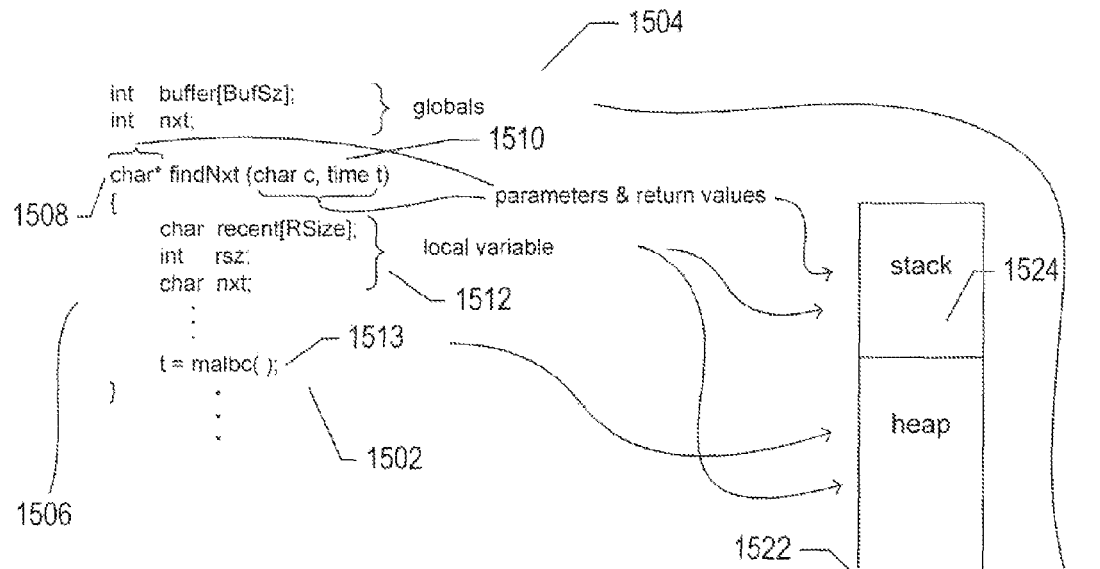
FIG. 15A illustrates a finer granularity of memory within the memory hierarchy discussed with reference to FIG. 14.

FIG. 15A illustrates a finer granularity of memory within the memory hierarchy discussed with reference to FIG. 14. In FIG. 15A, a small portion 1502 of a large application program is shown. The application program may consist of a number of global variable and data-structure declarations 1504 and a large number of routines, such as a first routine 1506 shown in FIG. 15A. Each routine may include a return value 1508 and one or more input parameters 1510. In addition, within each routine, a number of local variables and data structures 1512 may be declared and memory may be dynamically allocated 1513. The compiler used to compile application programs and the operating system that provides an execution environment for compiled application programs together allocate different types of logical memory for storing various types of variables and parameters declared and used in the application program. For example, the global variables 1504 may be stored in a general data portion 1520 of the main memory, characterized by less frequent access but longer lifetimes during, application-program execution.

Local variables and data structures 1512 declared within routines may be stored either in a stack portion 1524 of the main memory or a heap portion 1522 of the main memory. Heap memory 1522 may be implemented as a tree of variable-sized memory blocks, and is used to store data that is more frequently accessed and that has significantly lower lifetimes than global variables during execution of the application program. Memory dynamically allocated by calls to memory-allocation routines 1513 is allocated from heap memory 1522.

Return values and routine parameters 1508 and 1510 are generally stored in the stack portion 1524 of the main memory, which is characterized by quite frequent access and relatively short lifetimes during execution of the application program. Parameters and return values are pushed onto the stack 1524 as routines are called, and popped from the stack 1524 when routines terminate. Thus, the main memory may be further characterized as comprising stack memory, heap memory, general data memory, the portion of memory in which virtual-memory page tables are stored, and other portions of main memory used in different ways, and associated with different access times and longevities of stored information.

Figure 15B:
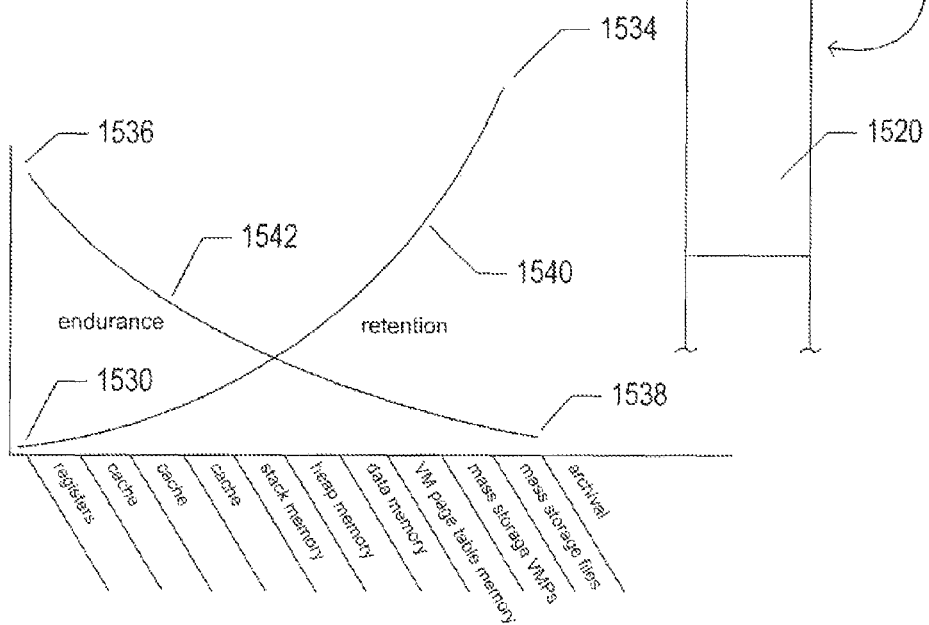
FIG. 15B summarizes, in a hypothetical graph, the endurance and retention characteristics associated with the different types of memory in the memory hierarchy of a computer system.

FIG. 15B summarizes, in a hypothetical graph, the endurance and retention characteristics associated with the different types of memory in the memory hierarchy of a computer system. As shown in FIG. 15B, the retention time associated with different types of memories ranges from nanoseconds 1530, for processor registers, to years, decades, or longer 1534 for archival memory. By contrast, because registers are so much more frequently accessed than archival memory, processor registers generally have high endurance 1536 while the endurance of archival memory 1538 can be substantially smaller, since the archival memory is so infrequently accessed. The retention and endurance characteristics associated with the various types of memories fall along hypothetical curves 1540 and 1542 for the various types of memory in the memory hierarchy.

Discussion of Example Embodiments

Different types of memory in the memory hierarchy discussed above with reference to FIGS. 14A-B and 15A-B have quite different architectures and internal data-storage organizations. However, with the advent of PCRAM and other newer types of memory technologies, it may be possible to apply a random-access-memory organization at the device level across many of the different memory types currently employed in computer systems, with non-volatile PCRAM replacing traditional types of both volatile and non-volatile memory. Therefore, the present disclosure is discussed in the context of a random-access-memory architecture.

Figure 16A:
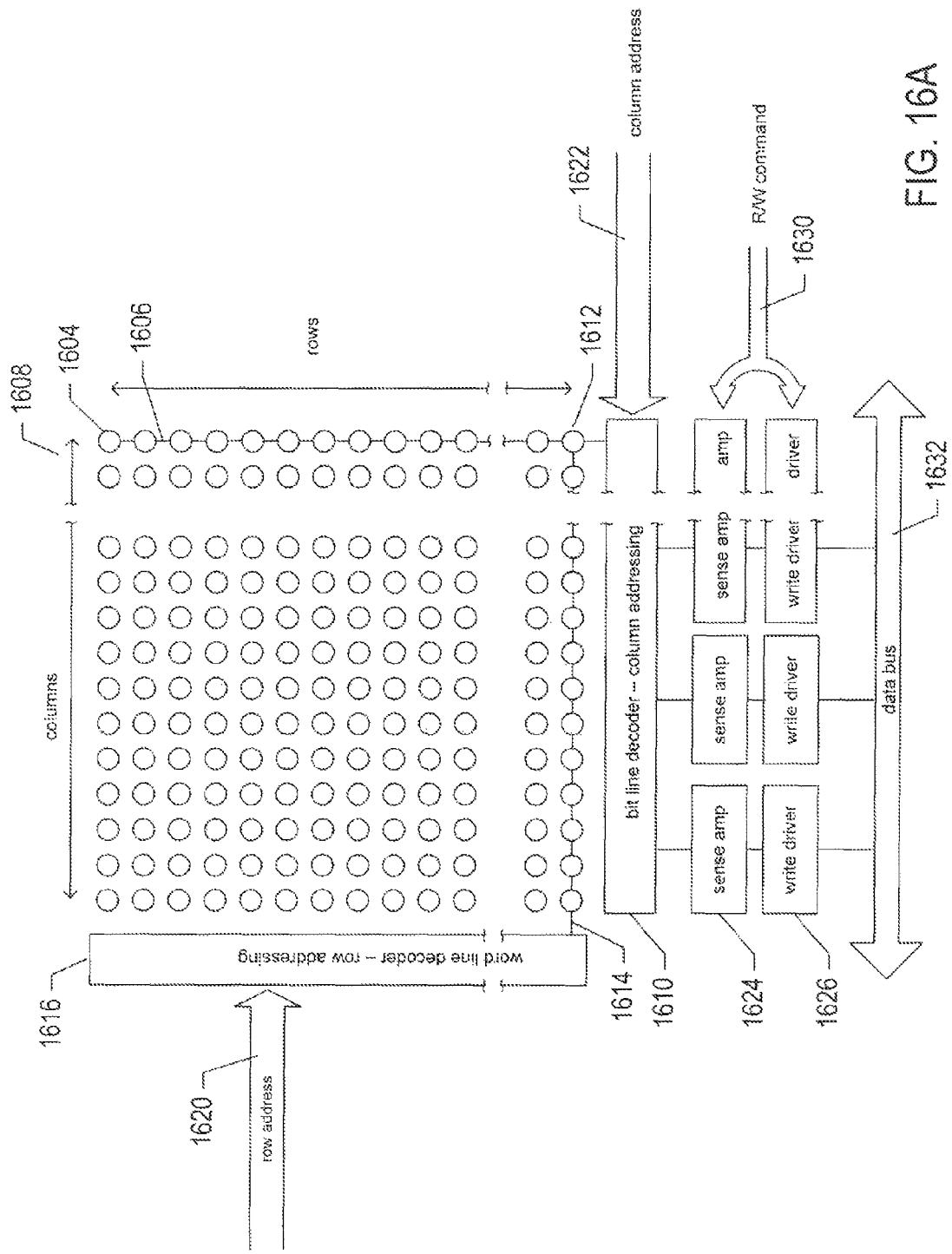
FIGS. 16A-B illustrate an array of memory cells that can be employed as a building block within random-access memories.
Figure 16B:
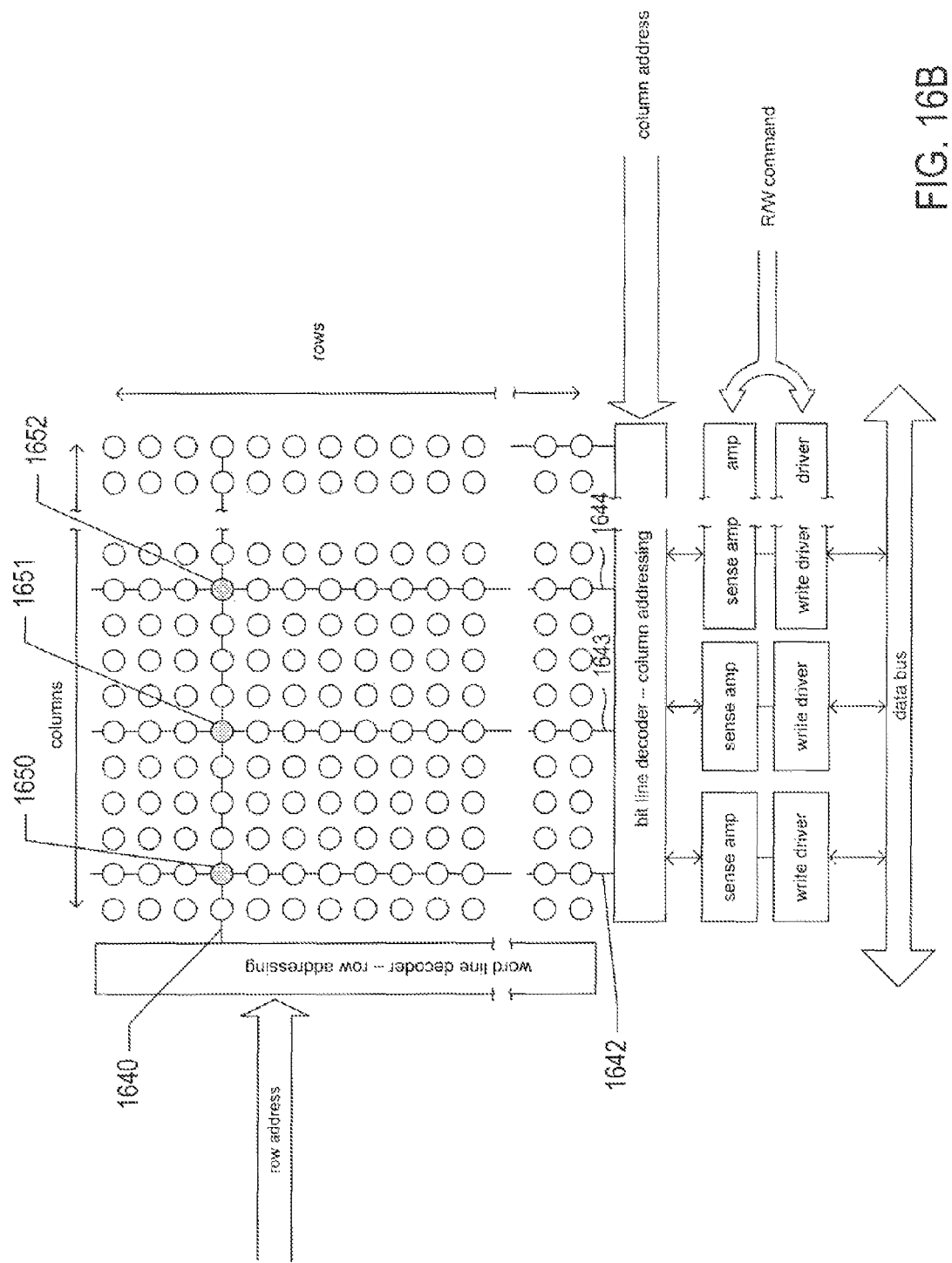

FIGS. 16A-B illustrate an array of memory cells that can be employed as a building block within random-access memories. FIG. 16A shows the components of a memory-cell array. In FIG. 16A, the memory cells are represented by disks, such as disk 1604. The memory cells are organized into columns and rows within the array. The memory cells in each column are interconnected by a bit line, such as bit line 1606 which interconnects the memory tells in the final column 1608 within the array. The bit lines interconnect the memory cells of a column with the bit-line decoder or column-addressing component 1610. The memory cells in each row, such as the memory cells in row 1612, are interconnected by a word line, such as word line 1614, which interconnects the memory cells with the word-line decoder or row-addressing component 1616. The word-line decoder 1616 activates a particular word line corresponding to a row address received through a row-address bus or signal lines 1620. The bit-line decoder or column-addressing component 1610 activates, at any given point in time, a number of bit lines that correspond to a particular column address, received through a column-address bus or signal lines 1622. The data contents of memory cells at the intersection of the active row, or word line, and the active columns, or bit lines, are determined by a number of sense amps, such as the sense amp 1624, and the data contents of the memory cells at the intersection of the active word line and active bit lines can be written by a number of write drivers, such as the write driver 1626. There is a sense amp and a write driver for each of the number of memory-cell columns activated by the bit-line decoder 1610 upon receiving a column address.

The operation of the sense amps and write drivers are controlled by READ and WRITE commands transmitted to the sense amps and write drivers through READ and WRITE command signal lines 1630. The data extracted from memory cells by sense amps during READ operations are transferred to a data bus 1632, and the data written by write drivers, during WRITE operations, into memory cells is transferred to the memory cells from the data bus 1632. FIG. 16B illustrates activation of the memory cells at the intersections of the active word line and active, bit lines. In FIG. 16B, the word-line decoder 1616 has activated word line 1640 and the bit-line decoder 1610 has activated bit lines 1642-1644. As a result, memory cells 1650-1652 are activated for either reading by sense amps or for data storage by write drivers, depending on the command received through the READ and WRITE command signal lines.

Figure 17:
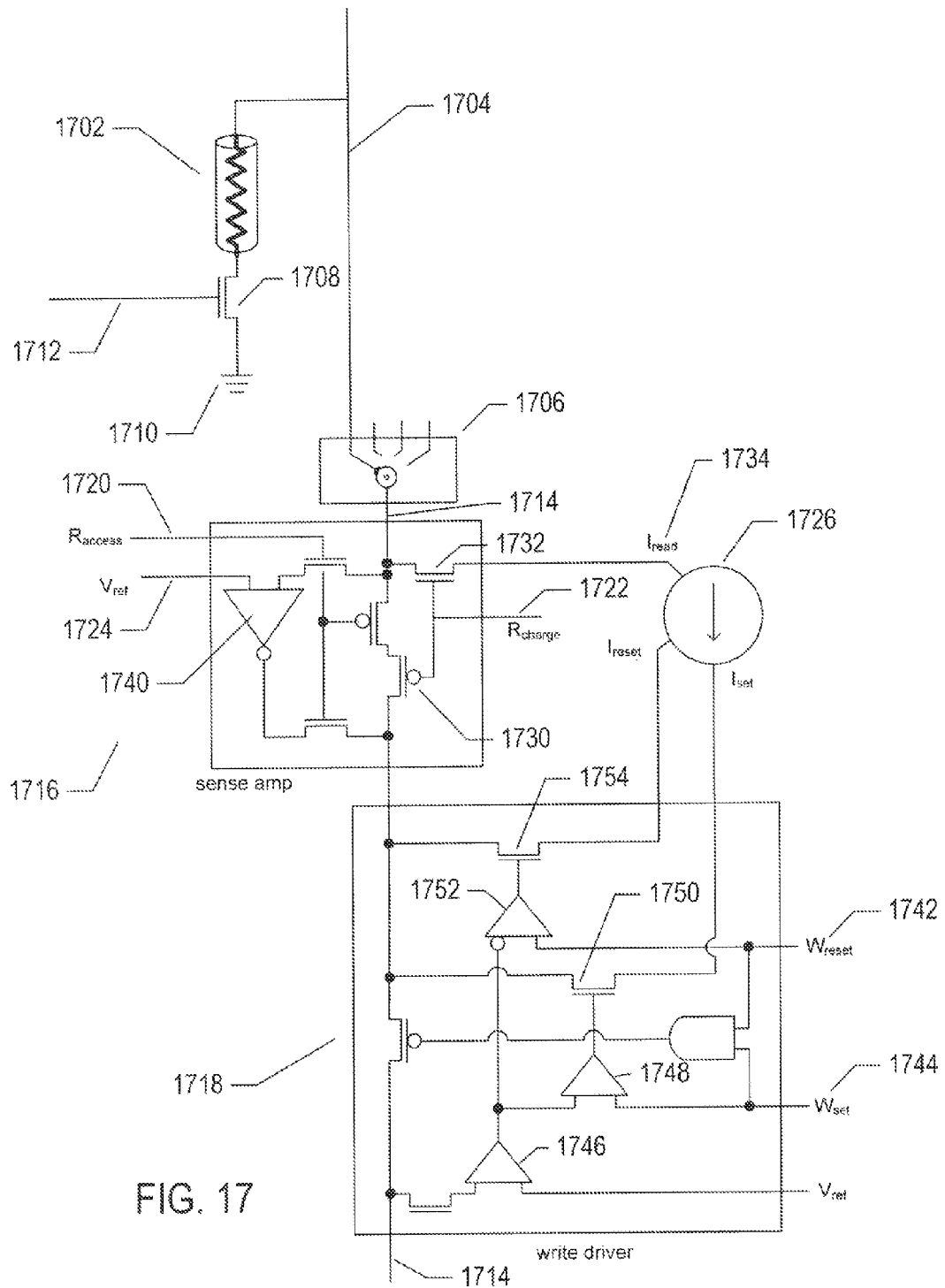
FIG. 17 illustrates simple, logical implementations of a sense amp and write driver associated with an output line from the bit-line decoder, or column-addressing component, of a memory-cell array.

FIG. 17 illustrates simple, logical implementations of a sense amp and write driver associated with an output line from the bit-line decoder, or column-addressing component, of a memory-cell array. As discussed above, the bit-line decoder multiplexes a number of bit lines within a memory-cell array in order to amortize the footprint and complexity of each sense amp and write driver over multiple bit lines. The number of sense-amp/write-driver pairs, such as sense-amp and write-driver pair 1624 and 1626 in FIG. 16A, corresponds to the number of bits output to, or input from, the data bus during each READ or WRITE operation. In FIG. 17, a single memory cell 1702 is shown as a resistor connected to a bit line 1704 currently selected by the column-addressing component of a memory-cell array 1706 and connected, through a transistor 1708, to a reference voltage, or ground 1710. The transistor 1708 is controlled by the word line 1712 interconnecting the transistor, and similar transistors of other memory cells in the same row such as memory cell 1702, to the word-line decoder component of a memory-cell array, not shown in FIG. 17. Assertion of the word line by the word-line decoder partially activates all of the memory cells controlled by the word line by interconnecting the memory cells to the reference voltage. The bit line 1704 is interconnected by the column-adjusting component to a signal line 1714 that interconnects a currently selected bit line, in the case of FIG. 17, bit line 1704, with a sense amp 1716 and a write driver 1718. The signal line 1714 continues to the data bus (1632 in FIG. 16A). A data value retrieved from the memory cell is output to the data bus via signal line 1714 and a data bit read from the data bus is input to the write driver 1718 through signal line 1714 and from the write driver 1718 to the memory cell 1702.

It should be noted that the implementations for the sense amp 1716 and write driver 1718 shown in FIG. 17 are logical, illustrative implementations and do not necessarily reflect detailed, practical implementations employed in real-world memory arrays. The sense amp, which is responsible for reading the stored data value and activated memory cell connected to the currently selected bit line, receives input signals $R_{access}$ 1720 and $R_{charge}$ 1722, and is additionally interconnected with a reference voltage, or ground 1724 and an independent current source 1726. A READ operation comprises at least two phases. In the first phase, input line $R_{charge}$ is asserted, disconnecting the bit line from the write driver 1718 by turning off the transistor 1730 and connecting the bit line to the independent current source 1726 by turning on the transistor 1732. The independent current source 1726 provides an $I_{read}$ current 1734 to the bit line 1704. When the resistivity state of the memory cell 1702 is low, or, equivalently, when the memory cell 1702 currently stores binary value "1," the input $I_{read}$ current flows to ground, and the voltage state of the bit line 1704 remains low, or approximately equal to the reference voltage. However, when the resistivity state of the memory cell 1702 is high, or, equivalently, the memory cell stores the binary value "0," then the input current $I_{read}$ charges the capacitance of the bit line 1704 and the memory cell 1702, raising the voltage of the bit line 1704.

Thus, assertion of the $R_{charge}$ input charges the capacitance of the bit line 1704 in the case that the memory cell 1702 currently stores the binary value "0." To read the contents of the memory cell 1702, following assertion of the $R_{charge}$ input signal 1722, the $R_{charge}$ input signal is de-asserted and the $R_{access}$ input signal 1720 is asserted. Assertion of the $R_{access}$ input results in an input of the voltage, if any, from the bit line 1704 to a differential-voltage sensor 1740 which compares the bit-line voltage to the reference voltage 1724. When the bit line voltage is approximately equal to the reference voltage, the sensor 1740 emits a relatively high-voltage signal to the signal line 1714. When, however, the voltage of the bit line 1704 is higher than the reference voltage, the sensor 1740 emits a relatively low-voltage signal to the signal line 1714. Assertion of the $R_{access}$ signal discharges the relatively small amount of stored charge in the bit line 1704.

The write driver 1718 receives a bit of data from the data bus on signal line 1714 and stores the received bit of data into the memory cell 1702. In the illustrated implementation shown in FIG. 17, two input signals $W_{reset}$ 1742 and $W_{set}$ 1744 are asserted by the write controller over two different periods of time $I_{reset}$ and $I_{set}$, respectively, to impellent the relatively shorter RESET operation and the longer SET operation. The $W_{reset}$ input signal is asserted for a short period of time in order to raise the internal temperature of the phase-change material within the memory cell 1702 above $T_m$, placing the memory cell 1702 into the amorphous phase. The $W_{set}$ input signal line is asserted for a longer period of time in order to allow for crystallization of the phase-change material. The write controller asserts both $W_{reset}$ 1742 and $W_{set}$ 1744, but the write driver 1718 is controlled by the bit value, or input data, received via signal line 1714 from the data bus.

When the input data corresponds to the binary value "1," or, in other words, the input signal has a relatively high voltage, the AND gate 1746 outputs a high-voltage signal that, when input to AND gate 1748 along with the asserted $W_{set}$ signal, turns on the transistor 1750, resulting in input of current $I_{set}$ from the independent current source 1726 to the signal line 1714. The signal output by the AND gate 1746 is inverted and input as a low-voltage signal into the AND gate 1752, which therefore emits a low signal that turns off the transistor 1754.

As a result, the internal temperature of the phase-change material rises above $T_c$ to place the phase-change material into the crystalline state, storing the binary value "1" into the memory cell. However, when the input data has a low voltage, corresponding to an input "0" binary value, the signal emitted from the AND gate 1746 fails to activate the transistor 1750 but activates the transistor 1754, which passes current $I_{reset}$ from the independent current source 1726 to the signal line 1714, raising the internal temperature of the phase-change material above $T_m$ to place the phase-change material into the amorphous state, storing the binary value "0" into the memory cell.

Figure 18A:
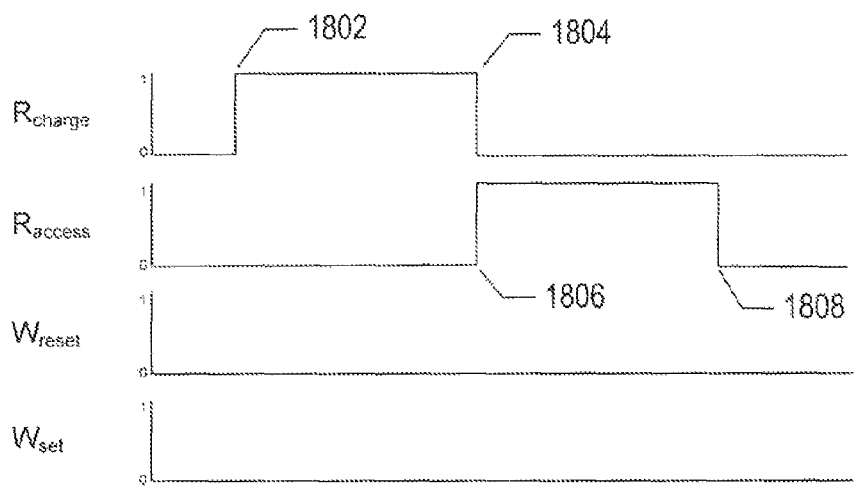
FIGS. 18A-B provide simple timing diagrams that illustrate READ and WRITE operations carried out via the sense amp and write-driver implementations discussed with reference to FIG. 17.
Figure 18B:
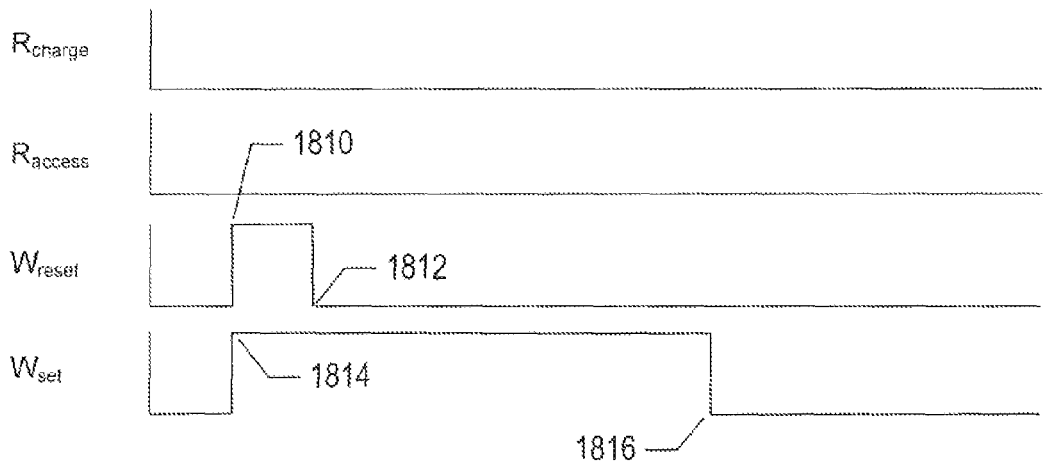

FIGS. 18A-B provide simple timing diagrams that illustrate READ and WRITE operations carried out via the sense amp and write-driver implementations discussed with reference to FIG. 17. FIG. 18A illustrates the READ operation. During the READ operation, both the $W_{reset}$ and $W_{set}$ input signal lines to the write driver remain de-asserted. The READ operation commences with assertion of the $R_{charge}$ input signal line 1802. Following charging of the bit-line capacitance, the $R_{charge}$ signal line is de-asserted 1804 and, at the same time, the $R_{access}$ input signal line is asserted 1806. Assertion of the $R_{access}$ signal line 1806 begins the second phase of the READ operation, in which a data value is output to the data bus. The READ operation finishes with de-assertion of the $R_{access}$ input signal line 1808.

FIG. 18B illustrates the WRITE operation. The WRITE operation begins with assertion of the $W_{reset}$ signal line 1810 and the $W_{set}$ input signal line 1814. The $W_{reset}$ signal line is asserted for a sufficient period of time to melt the phase-change material, following which the $W_{reset}$ signal line is de-asserted 1812, leading to quenching. The $W_{set}$ input signal line is asserted 1814 and remains asserted for a sufficient time to crystallize the phase-change material in those memory cells corresponding to input binary values "1" from the data bus. The WRITE operation finishes with de-assertion of the $W_{set}$ signal line 1816.

Figure 19:
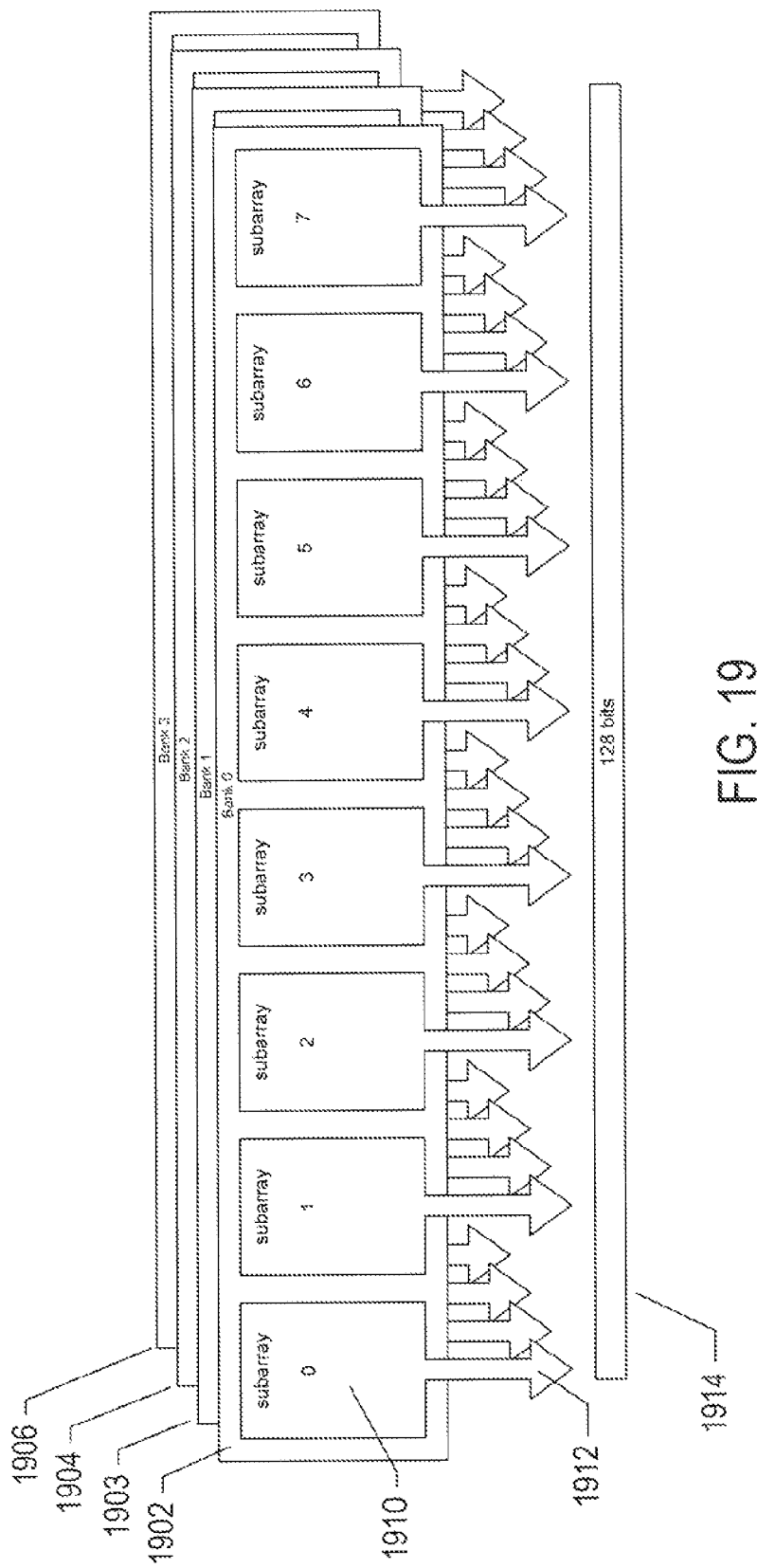
FIG. 19 illustrates organization of memory-cell arrays, such as the memory-cell array illustrated in FIG. 16A-B, into higher-level linear arrays, or banks within a memory device.

FIG. 19 illustrates organization of memory-cell arrays, such as the memory-cell array illustrated in FIG. 16A-B, into higher-level linear arrays, or banks within a memory device. As shown in FIG. 19, arrays of memory cells, such as the memory-cell array illustrated in FIG. 16A-B, can be organized into banks, such as bank 1902, and a memory device may contain multiple banks 1902-1905. Even higher levels of organization may be employed in certain types of memory devices. In the memory device shown in FIG. 19, during a single access operation, such as the READ access illustrated in FIG. 19, each memory-cell array, such as the memory-cell array 1910 in memory bank 1902, outputs four bits of data read from the array by four sense amps interconnected with the bit-line decoder of the array. Each downward-pointing arrow in FIG. 19, such as arrow 1912, represents four bits transmitted to the data bus. Because each bank contains eight memory-cell arrays, each bank furnishes 32 bits of data, and because there are four banks in the memory device, the READ access retrieves a total of 128 bits of stored data from the device 1914. Again, the organization illustrated in FIG. 19 is but one of many possible organizations of memory-cell arrays into a larger-capacity, multi-memory-cell-array data-storage device.

As discussed above, different applications of memory within a computer system are characterized by different retentions and endurances, as well as by different reliabilities. As discussed above, the reliability of a memory device or component can be adjusted and controlled by using any of various resiliency techniques. For example, individual memory-cell failures can be ameliorated by employing error correction encoding, with the increase in reliability proportional to the number of redundant bits added to data-storage units. Error detection and correction can be straightforwardly carried out by low-level memory-device circuitry that carries out the above-discussed matrix-based operations during READ operations. Higher-level data-redundancy can be introduced and managed at the memory-controller and higher levels within a computing system, including mirroring of data over multiple physical devices and striping data over multiple physical devices, using the mirroring and erasure-coding methods mentioned above. Reliability can thus be controlled by post-manufacturing techniques and adjustments. By contrast, the retention and endurance characteristics of a memory technology may appear to be largely determined by material characteristics and the architecture of memory cells and memory devices. However, as next discussed, the retention and endurance characteristics of a PCRAM memory cell, and of other types of memory cells, including memristor-based memory cells, can, according to example embodiments, also be controlled by post-manufacturing techniques and adjustments.

Figure 20A:
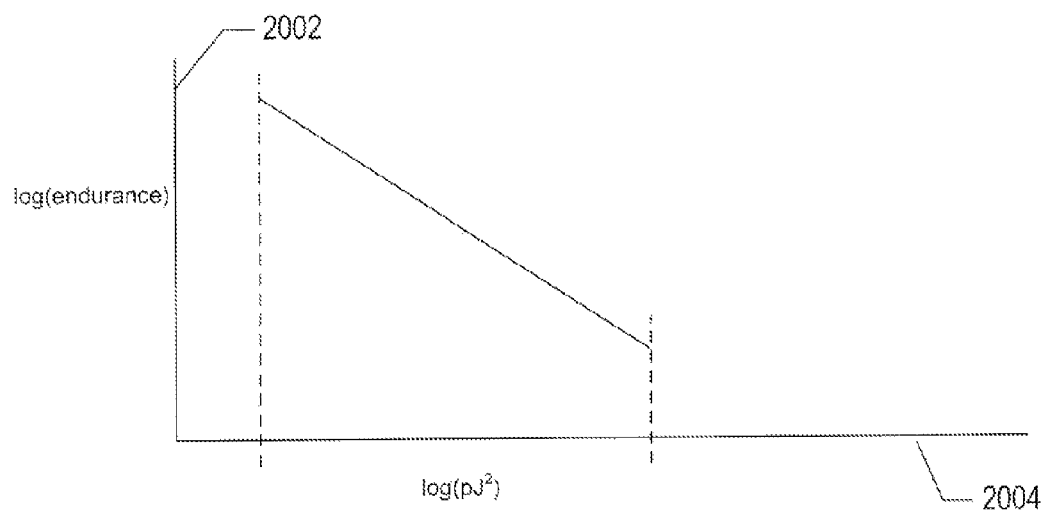
FIGS. 20A-B illustrate endurance and retention characteristics of phase-change-based memory cells and of memory-cell arrays and higher-level memory devices that employ phase-change memory cells.
Figure 20B:
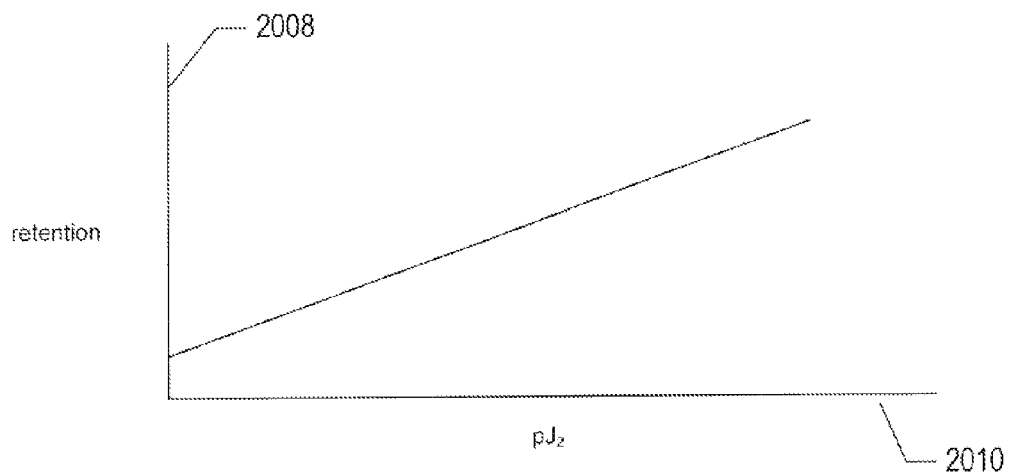

FIGS. 20A-B illustrate endurance and retention characteristics of phase-change-based memory cells and of memory-cell arrays and higher-level memory devices that employ phase-change memory cells. First, as shown in FIG. 20A, the logarithm of the endurance of a memory cell, represented by vertical axis 2002, is inversely, linearly related to the logarithm of the power dissipated within the phase-change material during the RESET operation, which is in turn proportional to the logarithm of the square of the current density $J$ applied to the memory cell during the RESET operation, represented by horizontal axis 2004. In other words, the greater the current density applied; the lower the endurance. However, as shown in FIG. 20B, the retention time for phase-change memory cells, represented by vertical axis 2008, increases with the energy dissipated during the RESET operation, represented by horizontal axis 2010. In other words, there is a trade-off, in phase-change-based memory cells, between operation of the cell to increase endurance and operation of the cell to increase retention times of data stored in the cell. Higher current densities used to achieve long retention times result in relatively low endurance, and low current densities used to increase the endurance of a memory cell result in relatively short retention times. The RESET operation is significant because higher temperatures are used to reset a memory cell than are used to set a memory cell. However, controlling current densities used for SET operations may, as a secondary effect, also affect retention and endurance characteristics of a memory cell.

Fortunately, as discussed above with reference to FIG. 15B, the endurance/retention characteristics of phase-change-based memory cells exhibit trends similar to trends of desired endurance and retention characteristics for various types of memory. Register memory, for example, desirably has short retention times but high endurance, while archival memory desirably has high retention times but relatively low endurance. Thus, by controlling the current densities employed during RESET operations, and by controlling the pulse times for RESET operations, a continuous range of endurance/retention trade-offs can be obtained during operation of a phase-change-based memory cell. Control of the RESET current densities and pulse times thus represent a post-manufacturing, operational parameter that can be dynamically adjusted in order to tailor a phase-change-based memory cell, or memory device containing phase-change-based memory cells, to particular applications, such as the various types of memory devices within a computer system discussed with reference to FIGS. 14A-B and 15A-B.

Figure 21:
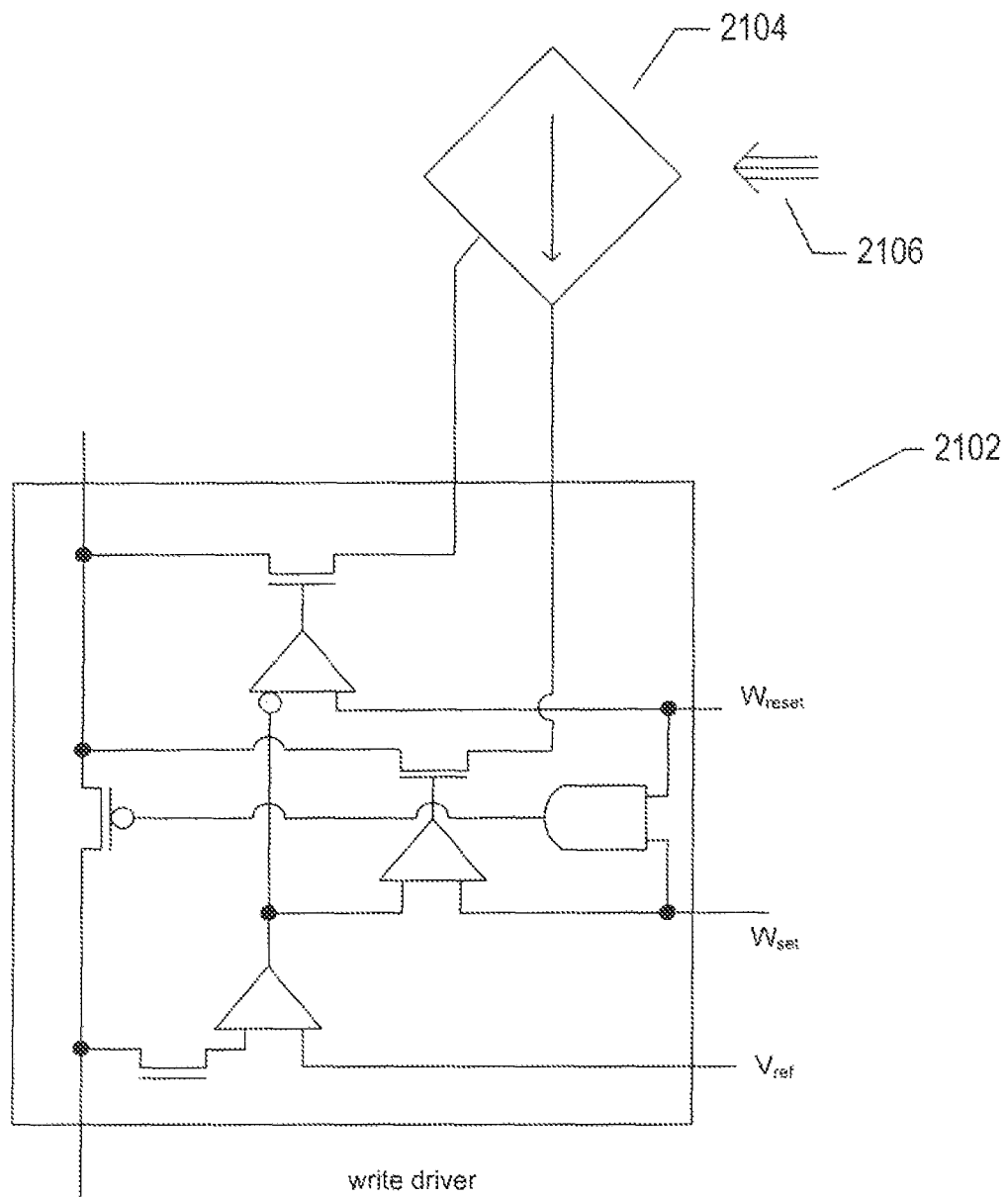
FIG. 21 illustrates an example write driver implementation that provides dynamic adjustment of current densities during access operations in order to provide dynamic adjustment of the endurance/retention characteristics of memory cells accessed by the write driver.

FIG. 21 illustrates an example write driver implementation that provides dynamic adjustment of current, densities during access operations in order to provide dynamic adjustment of the endurance/retention characteristics of memory cells accessed by the write driver. Comparison of the write driver 2102 shown in FIG. 21 and write driver 1718 shown in FIG. 17 reveals that write driver 2102 is connected to a dependent, signal-controlled current source 2104 rather than to an independent current source 1726 in FIG. 17. The dependent current source 2104 in FIG. 21 outputs currents corresponding to desired output current-value indications received over a sufficient number of input signal lines 2106 to specify a range of current values corresponding to the desired range of endurance/retention characteristics to which the write driver can be set. Operation of the variable-current write driver shown in FIG. 21 involves not only asserting and de-asserting input signal lines $W_{reset}$ and $W_{set}$, but also inputting desired currents $I_{set}$ and $I_{reset}$ to be produced by the dependent current source 2104 for input to the bit line and memory cell accessed by the write driver.

Figure 22:
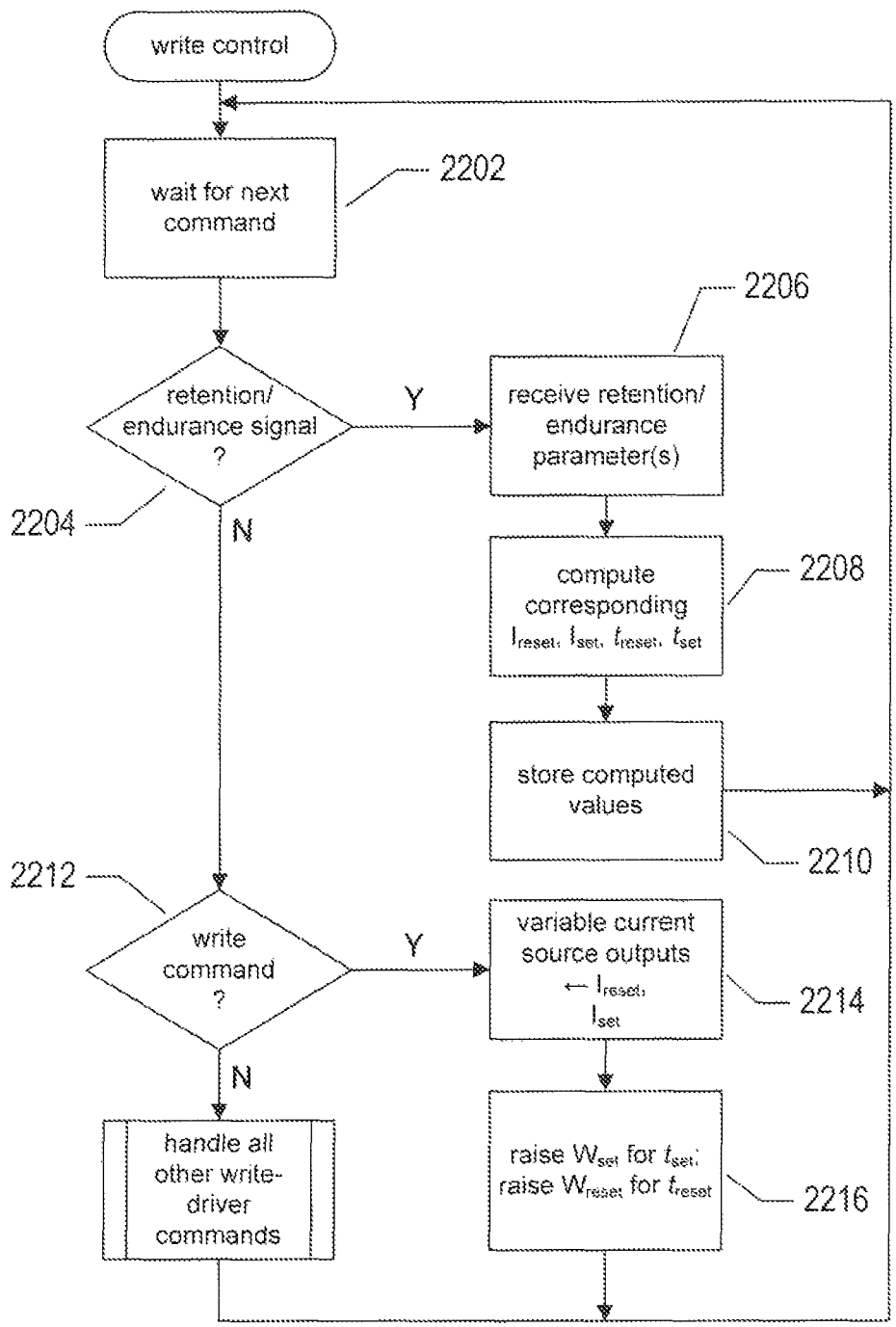
FIG. 22 provides a control-flow diagram for a write-control component of a memory device that controls write drivers within a memory device.

FIG. 22 provides a control-flow diagram for a write-control component of a memory device that controls write drivers within a memory device. The write-control component implementation is illustrated as an event loop, in which the write-control component waits for a next command, in step 2202, and then responds to a next received command. When the next received command is a command to set the retention/endurance characteristics of a particular subset or all the memory cells within a memory device, as determined in step 2204, then the write-control component receives a numerical retention/endurance parameter or parameters, in step 2206, computes corresponding RESET and SET currents for the desired retention/endurance characteristics, as well as corresponding RESET and SET pulse times, in step 2208, and stores the computed RESET and SET currents and RESET and SET pulse times, in step 2210, in a table or other data structure associated with the subset of memory cells which are intended to exhibit the retention/endurance characteristics. Otherwise, when the next command is a WRITE command, as determined in step 2212, then, for all of the write drivers connected to memory cells that are to be written, the write-control component sets the currents produced by the variable current source to $I_{reset}$ and $I_{set}$ in step 2214, as previously determined in step 2208 or a default $I_{reset}$ value, and then raises the $W_{reset}$ input signal line to the write drivers for the previously computed pulse time $t_{reset}$ and raises the $W_{set}$ input signal line for the previously computed pulse time $t_{set}$ 2220 in step 2216.

Thus, according to the disclosed examples, the write-control component and variable-current write drivers, illustrated in FIGS. 21 and 22, are employed within memory devices to allow the memory cells within the memory device, or subsets of the memory cells within the memory device, to be dynamically tailored for particular types of applications by dynamically adjusting the current densities and pulse times employed during the RESET and SET operations.

The dependent, variable current source 2104 shown in FIG. 21 can be implemented in many different ways, and the implementation may be either external to the write drivers of a memory-cell array, included in each write driver, or distributed among components external and internal to the write drivers. Implementations may include a charge pump comprising an array of capacitors coupled with a current mirror, or any of various additional types of circuitry and integrated-circuit components that can produce a selectable range of output currents.

In general, the retention/endurance characteristics of memory cells, data units, portions of the logical address space that represents the storage capacity of a memory device, and entire memory devices may be determined at the memory-controller, operating-system, or higher levels of control within a computer system. These retention/endurance characteristics may be continuously readjusted in order to tailor memory devices, during system operation, to changing types of data stored within the memory devices. The retention/endurance characteristics may be systematically varied in order to continuously redistribute different types of data, with different associated access frequencies, across the physical memory devices in order to effect access-frequency leveling to extend the useable lifetimes of the physical devices and the memory cells contained within them. Thus, higher levels of control dynamically determine the retention/endurance characteristics of physical memory and control the write controllers, which in turn control write drivers, within physical memory devices to apply currents and voltages to memory cells during access operations compatible with retention/endurance characteristics assigned to the memory cells by higher levels of control.

Although the present application has been described in terms of particular embodiments, it is not intended that the present disclosure be limited to these embodiments. Modifications will be apparent to those skilled in the art. For example, as discussed above, any of various types of circuits and circuit components can be employed in order to furnish selectable, varying current to bit lines through write drivers, with the selectable, varying current applied by circuitry and components within write drivers, external to write drivers, or distributed among internal and external components. The sense amps and write drivers illustrated in FIG. 17 can be implemented in a variety of different ways.

It is appreciated that the previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The invention claimed is:

1. A memory device comprising:
    an array of memory cells, each including a volume of material that can stably exhibit at least two different physical states that are each associated with a different data value;
    word lines that each interconnects a row of memory cells within the array of memory cells to a word-line driver; and
    bit lines that each interconnects a column of memory cells, through a bit-line driver, to a write driver that is controlled, during a WRITE operation, to write an input data value to an activated memory cell at the intersection of the column of memory cells and an activated row of memory cells by generating a current density within the activated memory cell that corresponds to retention/endurance characteristics of the activated memory cell dynamically assigned to the activated memory cell by a memory controller, operating system, or other control functionality.

2. The memory device of claim 1 wherein the volume of material is a volume of phase-change material.

3. The memory device of claim 1 wherein each of the at least two different physical states corresponds to a different resistivity state.

4. The memory device of claim 3 wherein each different resistivity state corresponds to a different atomic arrangement of the material and wherein the volume of material is placed into a resistivity state corresponding to an input binary data by generation of a current density selected from a range of current densities for a period of time selected from a range of periods of time within the volume of phase-change material of the activated memory cell.

5. The memory device of claim 3 wherein a current density and a period of time are selected to cause the material to adopt an atomic arrangement corresponding to an input binary data value input to a bit line from a data bus while maintaining a minimal, specified retention for a portion of the memory device including the activated memory cell.

6. The memory device of claim 1 wherein the write driver includes circuitry to interconnect a bit line with a dependent current source when either of a first input signal and a second input signal is asserted.

7. The memory device of claim 6 wherein the write driver further includes circuitry to disconnect the bit line from a data bus carrying a binary value to be written when either of the first input signal and the second input signal is asserted.

8. The memory device of claim 7 further including a write controller that carries out the WRITE operation to the activated memory cell by:
asserting both the first input signal and the second input signal; and
controlling the dependent current source to output selected currents.

9. The memory device of claim 8 wherein the write driver carries out the WRITE operation by:
directing the input data value from the data bus to a differential-voltage sensor which, in turn, connects a first of two different currents output from the dependent current source to the bit line when the input data value is a first value and connects a second of the two different currents output from the dependent current source to the bit line when the input data value is a second value.

10. The memory device of claim 9 wherein the write controller carries out the WRITE operation additionally by:
asserting the first input signal for a first pulse time; and
asserting the second input signal for a second pulse time.

11. A method for maintaining desired retention and endurance characteristics of a memory cell within a memory device, the method comprising:
determining a current density and time period for an access-related operation applied to the memory cell that together produce a state change within the memory cell and that produce a specified retention characteristic of the memory cell; and
during each access-related operation carried out on the memory cell,
applying the current density for the period of time determined for the access-related operation.

12. The method of claim 11 wherein the access-related operations applied to the memory cell comprise:
a SET operation that places the memory cell into a low-resistivity state; and
a RESET operation that places the memory cell into a high-resistivity state.

13. The method of claim 12 further comprising:
during the RESET operation, controlling a write driver and dependent current source to apply the current density for the time period determined for the RESET operation; and
during the SET operation, controlling the write driver and dependent current source to apply the current density for the time period determined for the SET operation.

14. A memory device comprising:
an array of memory cells, each including a volume of material that can stably exhibit at least two different physical states that are each associated with a different data value;
word lines that each interconnects a row of memory cells within the array of memory cells to a word-line driver;
bit lines that each interconnects a column of memory cells, through a bit-line driver, to a write driver and data-input medium; and
a write controller to control the word-line driver, the bit-line driver, and a write driver, during a WRITE operation, to write a data value from the data-input medium to an activated memory cell and to impart a specified retention to the activated memory cell, wherein a current density and time period that together produce a physical state to which the WRITE operation is directed, and that produce the specified retention for the activated memory cell are determined by a memory controller, operating system, or other control functionality that controls the memory device.

15. A memory device comprising:
an array of memory cells, each including a volume of material that can stably exhibit at least two different physical states that are each associated with a different data value;
word lines that each interconnects a row of memory cells within the array of memory cells to a word-line driver;
bit lines that each interconnects a column of memory cells, through a bit-line driver, to a write driver and data-input medium; and
a write controller to control the word-line driver, the bit-line driver, and a write driver, during a WRITE operation, to write a data value from the data-input medium to an activated memory cell and to impart a specified retention to the activated memory cell, wherein the write driver includes circuitry to interconnect a bit line with a dependent current source when either of a first input signal and a second input signal is asserted.

16. The memory device of claim 15 wherein the write driver further includes circuitry to disconnect the bit line from a data bus carrying the binary value to be written when either of the first input signal and the second input signal is asserted.

17. The memory device of claim 16 wherein the write controller carries out the WRITE operation to the activated memory cell by:
asserting both the first input signal and the second input signal; and
controlling the dependent current source to output selected currents.

18. The memory device of claim 17 wherein the write driver carries out the WRITE operation by:
directing the data value from the data-input medium to a differential-voltage sensor which, in turn, connects a first of two different currents output from the dependent current source to the bit line when the data value is a first value and connects a second of the two different currents output from the dependent current source to the bit line when the data value is a second value.

19. The phase-change-based memory device of claim 18 wherein the write controller carries out the WRITE operation additionally by:
  asserting the first input signal for a first pulse time; and
  asserting the second input signal for a second pulse time.

* * * * *